(12) United States Patent
Yamaji

(10) Patent No.: US 8,674,729 B2
(45) Date of Patent: Mar. 18, 2014

(54) HIGH VOLTAGE SEMICONDUCTOR DEVICE AND DRIVING CIRCUIT

(75) Inventor: Masaharu Yamaji, Matsumoto (JP)

(73) Assignee: Fuji Electric Co., Ltd., Kawasaki (JP)

( * ) Notice: Subject to any disclaimer, the term of this patent is extended or adjusted under 35 U.S.C. 154(b) by 7 days.

(21) Appl. No.: 13/256,222

(22) PCT Filed: Sep. 29, 2010

(86) PCT No.: PCT/JP2010/005867
§ 371 (c)(1), (2), (4) Date: Jun. 1, 2012

(87) PCT Pub. No.: WO2011/040016
PCT Pub. Date: Apr. 7, 2011

(65) Prior Publication Data
US 2012/0235712 A1 Sep. 20, 2012

(30) Foreign Application Priority Data

Sep. 29, 2009 (JP) ................. 2009-223822
Jun. 4, 2010 (JP) ................. 2010-128500

(51) Int. Cl.
*H03K 3/00* (2006.01)
(52) U.S. Cl.
USPC ............. 327/109; 257/502; 257/E29.012; 257/E21.427

(58) Field of Classification Search
USPC .......... 257/499, 500, 502, 504, E21.427, 257/E27.064, E29.012
See application file for complete search history.

(56) References Cited

U.S. PATENT DOCUMENTS

| 5,306,942 A | 4/1994 | Fujii |
| 5,894,156 A | 4/1999 | Terashima et al. |
| 6,326,831 B1 | 12/2001 | Kumagai |
| 6,586,780 B1 | 7/2003 | Terashima |

FOREIGN PATENT DOCUMENTS

| JP | 57-115857 A | 7/1982 |
| JP | 3-053561 A | 3/1991 |
| JP | 3-126255 A | 5/1991 |
| JP | 8-139200 A | 5/1996 |
| JP | 9-129762 A | 5/1997 |
| JP | 09-283716 A | 10/1997 |
| JP | 2000-252809 A | 9/2000 |
| JP | 2007-005823 A | 1/2007 |
| JP | 2008-135774 A | 6/2008 |

*Primary Examiner* — An Luu
(74) *Attorney, Agent, or Firm* — Rabin & Berdo, P.C.

(57) ABSTRACT

A high voltage semiconductor device is provided and includes an $n^-$-type region encompassed by a $p^-$ well region and is provided on a $p^-$-type silicon substrate. A drain $n^+$-region is connected to a drain electrode. A p base region is formed so as to be separate from and encompass the drain $n^+$-region. A source $n^+$-region is formed in the p base region. Further, a $p^-$-region is provided that passes through the $n^-$-type region to the silicon substrate. The $n^-$-type region is divided, by the $p^-$-region, into a drift $n^-$-type region having the drain $n^+$-region and a floating $n^-$-type region having a floating electric potential.

22 Claims, 18 Drawing Sheets

HIGH VOLTAGE SEMICONDUCTOR DEVICE AND DRIVING CIRCUIT

TECHNICAL FIELD

The present invention relates to a high voltage semiconductor device and driving circuit. In particular, the invention relates to, for example, a control electrode of a controllable semiconductor element such as a semiconductor switching element in an upper arm of an electric power inverting bridge circuit in a PWM inverter or a switching power supply, i.e., a high voltage semiconductor device used as a level shift circuit that is used when a turning-on or -off signal is transmitted without any particular electric potential insulation from a circuit connected to a common electric potential point to the control electrode of a controllable semiconductor device in a circuit in which the electric potential of an electrode (such as an emitter electrode or a source electrode), which is to be the reference for the electric potential of an input driving control signal, changes with respect to a common electric potential such as the ground potential. Furthermore, the invention relates preferably to a high voltage semiconductor device used in a level shift circuit that can be utilized in a form of a high voltage IC (HVIC).

BACKGROUND ART

Power devices are widely used in various fields and in addition to being used as inverters for controlling motors, are used as power supplies for display panels such as large-capacity plasma display panels (PDPs) and liquid crystal display panels, and as inverters for home appliances such as air-conditioners and lighting fixtures. The driving and control of such power devices has been carried out by an electronic circuit formed by combining electronic parts such as semiconductor devices like photocouplers and transformers. However, recent advancements in large-scale integrated circuit (LSI) technologies have enabled practical use of high voltage ICs of up to 1200V, facilitating high voltage ICs that integrate power semiconductor devices as high side gate drivers and low side gate drivers as well as those that integrate a control circuit and a power semiconductor device on the same semiconductor substrate, thereby contributing to greater efficiency, and a reduction in the number of parts and in mounting area.

FIG. 13 is a circuit diagram of a high voltage IC having an ordinary level shift circuit. In FIG. 13, diodes 41 and 42 are added to the circuit shown in FIG. 8 of Patent Document 1. In FIG. 13, reference numerals 17 and 18 denote IGBTs (output power devices) connected in series between a positive electrode side terminal Vdc of a main DC power supply of a high voltage of 400V, for example, and a common electric potential point COM (the ground in FIG. 13) as a negative electrode side of the power supply to form one phase of, for example, an electric power inverting bridge circuit of a PWM inverter. An OUT terminal is a connection point of the emitter of the IGBT 17 in the upper arm of the bridge circuit and the corrector of the IGBT 18 in the lower arm of the bridge circuit. The OUT terminal is also an AC output terminal for AC electric power generated by the alternate turning-on and -off of the IGBTs 17 and 18.

The sign E2 denotes an auxiliary power supply (also referred to as a driver power supply) whose positive electrode is connected to a positive electrode line Vcc2 and negative electrode is connected to a common electric potential point COM and that supplies a low voltage of, for example, 15V. Reference numeral 20 denotes a driver that carries out on and off driving of the IGBT 18 in the lower arm and is operated by the auxiliary DC power supply E2.

Other components in the circuit form a level shift circuit for driving the IGBT 17 in the upper arm of the bridge circuit. Reference numerals 1 and 2 denote a high voltage MOSFET. The high voltage MOSFET 1 conducts with the input of an on-signal 25. The on-signal 25 is a pulse signal generated by a control circuit 61 (low electric potential side, low blocking voltage circuit) to which a current is supplied by a low voltage power supply whose reference electric potential is that on the negative electrode side of the main DC power supply (the COM electric potential). Conduction by the high voltage MOSFET 1 causes a voltage drop at the connection point of the high voltage MOSFET 1 and a load resistor 3. With the voltage drop taken as a signal, the IGBT 17 is turned-on. Similarly the high voltage MOSFET 2 conducts with the input of an off-signal 26 that is a pulse signal generated by the control circuit 61. Conduction by the high voltage MOSFET 2 causes a voltage drop at the connection point of the high voltage MOSFET 2 and a load resistor 4. With the voltage drop taken as a signal, the IGBT 17 is turned-off.

Here, in general, the high voltage MOSFETs 1 and 2 are equivalent and the load resistor 3 and 4 are also equivalent. Moreover, voltage-regulator diodes 5 and 6 connected in parallel to the load resistors 3 and 4 restrict excessive voltage drops across the load resistors 3 and 4 play roles in respectively protecting components such as NOT circuits 8 and 9, explained hereinafter. Among the level shift circuits, the two high voltage MOSFETs 1 and 2 are circuit sections to which signals are input having the electric potential at the static common electric potential point COM as a reference.

The circuit section encompassed by a dotted line is a high electric potential side, low voltage circuit section (floating electric potential region) that is operated with the electric potential at the AC output terminal OUT as a reference. The electric potential at the AC output terminal OUT alternately changes to the electric potential at the common electric potential point COM and to the electric potential at the positive electrode side terminal Vdc of the high voltage main DC power supply, by the alternate turning-on and -off of the output IGBTs 17 and 18. Reference symbol E1 in the section of the circuit encompassed by the dotted line denotes an auxiliary DC power supply (also referred to as a driver power supply) supplying a voltage of 15V and for example, whose positive electrode and negative electrode are connected to a positive electrode line Vcc1 and the AC output terminal OUT, respectively. Although the auxiliary DC power supply E1 in FIG. 13 is a power supply with the electric potential of the AC output terminal OUT taken as a reference electric potential, if the IGBT 17 is a p-channel type, the auxiliary DC power supply may be provided with the electric potential of the positive electrode side terminal Vdc taken as the reference electric potential.

The NOT circuits 8 and 9 and circuits downstream (such as low pass filter circuits (LPF) 30 and 31, an RS flip-flop (RS latch) 15 and a driver 16) are operated using the auxiliary DC power supply E1 as a power supply. The load resistor circuit configured by the high voltage MOSFET 1 and the load resistor 3, or the load resistor circuit configured by the high voltage MOSFET 2 and the load resistor 4 is connected between the positive electrode line Vcc1 of the auxiliary DC power supply E1 and the common electric potential point COM and is operated using, as a power supply voltage, the voltage between the positive electrode line Vcc1 of the auxiliary DC power supply E1 and the common electric potential point COM. Because the electric potential of the AC output terminal OUT connected to the negative electrode of the auxiliary DC power supply E1 changes between the electric potentials of the common electric potential point COM and the positive electrode side terminal Vdc, the power supply voltage changes between E1+Vdc and E1 (in actuality, the cathode of a non-depicted, free wheeling diode is connected to each of the corrector sides of the IGBTs 17 and 18, whereby in a free wheeling mode of the free wheeling diode, sometimes causes the electric potential at the AC output terminal OUT to have a negative value on the order of several volts with respect to the common electric potential point COM).

Next, the operation of the level shift circuit will be explained. The on-signal 25 applied to the gate of the high voltage MOSFET 1 induces an electric current in the high voltage MOSFET 1, causing the electric potential to drop at the connection point of the load resistor 3 and the high voltage MOSFET 1. With the electric potential at the connection point becoming less than or equal to the threshold voltage of the NOT circuit 8, the NOT circuit 8 outputs a high level signal Hi. The high level signal Hi is applied to the set terminal S of the RS latch 15 through the LPF 30, is output from the output terminal Q of the RS latch 15, and applied to the gate of the IGBT 17 via the driver 16, turning-on the IGBT 17. At the same time (strictly speaking, at a time slightly before the IGBT 17 turns-on, to prevent an inter-arm short circuit), the IGBT 18 is turned-off by a signal transmitted through the driver 20 from the control circuit 61.

Subsequently, the off-signal 26 applied to the gate of the high voltage MOSFET 2 induces an electric current in the high voltage MOSFET 2, causing the electric potential to drop at the connection point of the load resistor 4 and the high voltage MOSFET 2. With the electric potential at the connection point becoming equal to or less than the threshold voltage of the NOT circuit 9, the NOT circuit 9 outputs a high level signal Hi that is applied to the reset terminal R 21 of the RS latch 15 through the LPF 31, causing the output of a low level signal Lo from the output terminal Q of the RS latch 15. The low level signal Lo is applied to the gate of the IGBT 17 through the driver 16 and turns-off the IGBT 17. At the same time (strictly speaking, at a time slightly after the IGBT 17 turns-off, to prevent an inter-arm short circuit), the IGBT 18 is turned-on by a signal transmitted through the driver 20 from the control circuit 61.

When the IGBT 18 is turned-off and the IGBT 17 is turned-on, an abrupt increase in electric potential dv/dt occurring at the AC output terminal OUT due to the switching, charges the drain-source capacitance of each of the high voltage MOSFETs 1 and 2. The charging currents at this time induce a voltage drop different from that resulting from the true on-signal or the true off-signal at the connection point of the load resistor 3 and the high voltage MOSFET 1 and at the connection point of the load resistor 4 and the high voltage MOSFET 2, causing a malfunction of the RS latch 15, whereby the IGBT 17 may be turned-on inadvertently, causing an inter-arm short circuit of the bridge circuit or an unnecessary turning-off of the IGBT 17.

Similar abnormal voltage drops may occur at the connection point of the load resistor 3 and the high voltage MOSFET 1 and at the connection point of the load resistor 4 and the high voltage MOSFET 2 during times other than at the switching of the IGBTs 17 and 18 and may be caused by external noise. The low pass filter circuits 30 and 31 are inserted to prevent such malfunctions in the RS latch 15 by performing a role of eliminating, as abnormal signals, input signals having small pulse widths (higher frequencies) caused by switching or external noise.

As shown in FIG. 13, the IGBT 17 and 18 are turned-on and-off by using the on-signal 25 and the off-signal 26, which are pulse signals, because to carry out high speed switching of AC signals output from a circuit such as a PWM inverter, the frequency of a carrier for turning-on and -off an output switching device is preferably increased, namely, a level shift circuit is preferably operated at a high speed. Increasing the frequency of the carrier for turning-on and -off the switching device is related to increasing the frequency of the PWM inverter, which has a merit of making it possible to downsize coils on the power supply circuit board in the inverter system, thereby enabling reduction of the area of the power supply board.

Therefore, to operate a level shift circuit at a high speed, it is necessary to let relatively large electric current flow in the high voltage MOSFETs 1 and 2 of a level shift circuit. However, as shown in the section encompassed by the dotted line in FIG. 13, in the high electric potential side, low voltage circuit section, whose reference electric potential changes, particularly in the case when the reference voltage is high, losses due to the relatively large electric current increase. For example, when each of the high voltage MOSFETs 1 and 2 is turned-on with a signal that is input to the gate and generated by a pulse generator, if an on-current of 10 mA flows in each of the high voltage MOSFETs 1 and 2, the voltage of the positive electrode side terminal Vdc of main DC power supply is 400V, and the duty cycle for the turning-on and -off of the high voltage MOSFETs 1 and 2 is 10 percent on average; the average loss for each of the high voltage MOSFETs 1 and 2 is on the order of 0.4W.

Moreover, Patent Document 2 describes a high voltage IC having a high side gate driver and a level shift circuit of a power device. In the high voltage IC, a high voltage MOSFET for the level shift and an isolated island region (floating electric potential region) are connected by wiring formed, through an insulating film, on a semiconductor substrate. Thus, between the high voltage MOSFET and the isolated island region, the semiconductor substrate is exposed from an opening selectively formed in the insulating film and this exposed region is connected to the wiring. When a high voltage is applied to wiring connecting the high voltage MOSFET and the isolated island region, a depletion layer expanding from the high voltage MOSFET and a depletion layer expanding from the isolated island region meet, increasing the electric potential of the region where the substrate beneath the wiring is exposed.

CITATION LIST

Patent Literature

[PTL 1]
Japanese Patent No. 3,635,975
[PTL 2]
Japanese Patent No. 3,917,211

SUMMARY OF INVENTION

Technical Problem

As explained, in the circuit shown in FIG. 13, when the IGBT 18 is turned-off and the IGBT 17 is turned-on by the switching, an abrupt increase in electric potential, so-called a dV/dt surge, occurs at the AC output terminal OUT to largely change the electric potential at the AC output terminal OUT. This further causes a similar change in the electric potential of the positive electrode line Vcc1 of the auxiliary DC power supply E1.

Hereinafter, an explanation will be made with respect to a malfunction caused by change in the electric potential of the AC output terminal OUT and the electric potential of the positive electrode line Vcc1. First, the high voltage MOSFETs 1 and 2 respectively have parasitic output capacitances 51 and 52 that each includes a drain-substrate capacitance Cdsub and a drain-source capacitance Cds as output capacitance occupying a large proportion of parasitic capacitance when the drain voltage is increased. When a dV/dt surge occurs, transient electric currents of magnitudes corresponding to the magnitude of the surge flow from the positive electrode side of the auxiliary DC power supply E1 and through the parasitic output capacitances 51 and 52, whereby a state occurs similar to that where the high voltage MOSFETs 1 and 2 are turned-on. In this case, at a node (drain-side node) connected to the drain of the high voltage MOSFET 1 to which the on-signal 25 is input and at the drain-side node of the high voltage MOSFET 2 to which the off-signal 26 is input, a false signal appears due to a displacement current. Here, even if the on-signal 25 is input to the high voltage MOSFET 1 or the off-signal 26 is input to the high voltage MOSFET 2 during a period in which a displacement current charges the parasitic output capacitance 51 or 52 of the high voltage MOSFET 1 or 2, respectively, no signal is transmitted downstream, i.e., the period becomes a period of delay.

In addition, the parasitic output capacitance 52 of the high voltage MOSFET 2 may increase by an order of 10 percent due to manufacturing variation. If the electric potential at the connection point of the load resistor 4 and the high voltage MOSFET 2 becomes equal to or less than the threshold value of the NOT circuit 9 due to a voltage drop, represented by the product of the resistance of the resistor 4 and the displacement current as the product of the capacitance of the parasitic output capacitance 52 and the rate of change in voltage with respect to time dV/dt, a high level signal Hi at the node connected to the drain of the high voltage MOSFET 2 is applied to the reset terminal R 21 of the RS latch 15 through the LPF 31. In the RS latch 15, the signal input to the reset terminal R 21 has priority, thereby causing the RS latch 15 to output a low level signal Lo from the output terminal Q. As a result, even though the off signal 26 has not been input to the high voltage MOSFET 2, the low level signal Lo applied to the IGBT 17 through the driver 17 turns-off the IGBT 17, causing a malfunction of the high voltage IC.

An explanation will be made with respect to the malfunction. First, the electric potential at the AC output terminal OUT and the electric potential of the positive electrode line Vcc1 are changed by a dV/dt surge, causing a displacement current I1 to transiently flow to the drain-side node of the high voltage MOSFET 1 and a displacement current I2 to transiently flow to the drain-side node of the high voltage MOSFET 2. In the high voltage IC shown in FIG. 13, to allow a surge current to flow to the section at the common electric potential point COM, a diode 41 is connected between the drain of the high voltage MOSFET 1 and the AC output terminal OUT, and a diode 42 is connected between the drain of the high voltage MOSFET 2 and the AC output terminal OUT.

Here, when the electric potential at the AC output terminal OUT and the electric potential of the positive electrode line Vcc1 are changed by the dV/dt surge, current components flowing through the diodes 41 and 42 respectively correspond to i1 and i2 shown in FIG. 13 and current components flowing through the load resistors 3 and 4 correspond to i1' and i2', respectively, shown in FIG. 13. The displacement currents I1 and I2 are the sum of the current components i1, i1', i2, and i2' (displacement current components) flowing to the drain-side nodes of the MOSFET 1 and 2 by way of the diodes 41 and 42 and the load resistors 3 and 4. The displacement currents I1 and I2 are expressed as: I1=i1+i1' and I2=i2+i2'.

The dV/dt surge not only increases the electric potential at the AC output terminal OUT but also the electric potential of the positive electrode line Vcc1 of the auxiliary DC power supply E1. Thus, immediately after the change in the electric potential due to dV/dt surge, the minute displacement currents i1' and i2' flow to the common electric potential point COM through the load resistors 3 and 4 and the high voltage MOSFETs 1 and 2, respectively. When a voltage drop occurs at the connection point of the load resistor 3 and the high voltage MOSFET 1 caused by the minute displacement current i1' flowing in the load resistor 3 and a voltage drop at the connection point of the load resistor 4 and the high voltage MOSFET 1 caused by the minute displacement current i2' become equal to or greater than the electric potential difference between the positive electrode line Vcc1 of the auxiliary DC power supply E1 and the AC output terminal OUT (here, taken as 15V) and become less than the electric potential of the AC output terminal OUT by 0.6V or more, a forward current of each of the diodes 41 and 42 begins to flow. Namely, most of the displacement current components i1' and i2' due to the abrupt dV/dt surge of tens of kilovolts per microsecond flow through the diodes 41 and 42, charging the parasitic output capacitances 51 and 52 of the high voltage MOSFETs 1 and 2, respectively. When the resulting minute displacement current components i1' and i2' charge the parasitic output capacitances 51 and 52 of the high voltage MOSFETs 1 and 2, respectively, the electric potential difference at the load resistors 3 and 4 becomes at least 15.6V, causing both of the NOT circuits 8 and 9 to output high level signals Hi. The RS latch 15 being unable to differentiate between a set signal S and a reset signal R, does not accept the high level signals Hi as input signals and consequently, no malfunction occurs. However, for a gradual dV/dt surge of several kilovolts per microsecond, the minute displacement current components i1' and i2' become predominant and the voltage drops at the respective connections of the MOSFET 1 and the load resistor 3 and of the MOSFET 1 and the load resistor 4 approach the threshold voltages (Vth) of the NOT circuits 8 and 9. Thus, in some cases, one of the NOT circuit 8 or 9 outputs a high level signal Hi, which is transmitted as a false signal to the RS latch 15.

The threshold voltages Vth of the NOT circuits 8 and 9 explained here depends on the respective current driving abilities of the NMOS and the PMOS forming the CMOS inverter circuit in each of the NOT circuits 8 and 9. Assuming the current driving abilities of the NMOS and the PMOS are equivalent, the threshold voltage Vth is given as: (the electric potential difference between the auxiliary DC power supply E1 and the AC output terminal OUT (15V))/2=7.5 (V).

Here, an explanation will be made with respect to a false signal triggered by the displacement current components i1' and i2' when the parasitic capacitance components of the high voltage MOSFET 1 and 2 differ. When a dV/dt surge of several kilovolts per microsecond is applied to the AC output terminal OUT and the minute displacement current components i1' and i2' flowing between the positive electrode line Vcc1 of the auxiliary DC power supply E1 and the AC output terminal OUT exceed 1.5 mA((the threshold voltage 7.5V of the NOT circuits 8 and 9)/(resistance of 5.0 kilo-ohm of the load resistors 3 and 4)), a signal output from either of the NOT circuits 8 and 9 is input to either the set terminal S or the reset terminal R 21 of the RS latch 15 as a high level signal Hi, by which a false signal is transmitted from the output terminal Q of the latch 15 to the IGBT 17.

Here, for example, if the combined capacitance Cn1 of the parasitic output capacitance 51 (Cds+Cdsub) of the high voltage MOSFET 1 is 2 pF ($2*10^{-12}$F), the combined capacitance Cn2 of the parasitic output capacitance 52 (Cds+Cdsub) of the high voltage MOSFET 2 is 2.2 pF (($2.2*10^{-12}$), assuming that the capacitance is increased by 10 percent due to variation in manufacturing process), and the resistance of each of the load resistors 3 and 4 is 5.0 kilo-ohm ($5.0*10^3$-ohm), where a dV/dt surge of 0.7 kV/microsecond ($0.7*10^3/10^{-6}$=$0.7*10^9$V/S) is input to the AC output terminal OUT, then a voltage drop that can cause a false signal on the side to which the on-signal 25 is input or on the side to which the off-signal 26 is input, is estimated as follows.

Namely, in general, the amount of electric charges Q in a capacitance Cn to which a voltage V is applied is expressed by equation (1). Thus, when the voltage is changed with respect to time t as the dV/dt surge, the amount of charge also changes and the rate of the change dQ/dt is equal to the electric current i input to or output from the capacitance C and is expressed by equation (2).

$$Q=Cn*V$$

$$i=dQ/dt=Cn*dV/dt$$

Therefore, the voltage drop V1 due to the electric current i in the load resistor R is obtained by equation (3).

$$V1=i*R=Cn*dV/dt*R$$

Thus, the voltage drop Vs1 at the connection point of the load resistor 3 on the side to which the on-signal 25 is input (i1' side) and the high voltage MOSFET 1, according to equation (3) is Vs1=$2*10^{-12}*0.7*10^9*5*10^3$=7.0 (V). Further, the voltage drop Vr1 at the connection point of the load resistor 4 on the side to which the off-signal 26 is input (i2' side) and the high voltage MOSFET 2, according to equation (3), is Vr1=$2.2*10^{-12}*0.7*10^3/1*10^{-6})*5*10^3$=7.7 (V). Here, the voltage drop at the connection point of the load resistor 4 on the side to which the off-signal 26 is input and the high voltage MOSFET 2 exceeds the threshold voltage Vth=7.5V and consequently, the NOT circuit 9 alone erroneously outputs a high level signal Hi.

To reduce the voltage drop causing the false signal, one approach is to reduce the resistance of each of the load resistors 3 and 4 for level shifting, from 5 kilo-ohm to 1 kilo-ohm. This, however, causes the following problem. Assuming that the on-current of each of the high voltage MOSFETs 1 and 2 is set at its saturation current of 10 mA when the resistance of each of the load resistor 3 and 4 being used is 5 kilo-ohm, then, when the resistance of each of the load resistors 3 and 4 is 1 kilo-ohm, it is necessary to let a saturation current of 50 mA flow. When a saturation current of 50 mA is made to flow in each of the high voltage MOSFETs 1 and 2, if the voltage of the positive electrode side terminal Vdc of a main DC power supply is 400V and assuming driving signals input to the gates of the high voltage MOSFETs 1 and 2 to turn-on and -off the high voltage MOSFETs 1 and 2 are generated by a pulse generator and the duty cycle for turning-on and -off each of the high voltage MOSFET 1 and 2 is 10 percent on average, then the average power dissipation of the high voltage MOSFETs 1 and 2 in a state where the corrector of the IGBT 17 is at a high potential becomes as high 2.0W. Consequently, the allowable power dissipation for a resin encapsulation package for a high voltage IC is significantly exceeded. Normally, even with a package having enhanced heat dissipation, the allowable power dissipation is on the order of 0.8W at most. Thus, to make the average power dissipation of each of the high voltage MOSFETs 1 and 2 to be 0.8W or less, it is necessary to reduce the duty cycle for turning-on and -off each of the high voltage MOSFETs 1 and 2 to 4 percent or less.

When, however, the duty cycle for "on" is reduced, particularly when high switching frequencies from hundreds of kilohertz to thousands of kilohertz are used such as in power supply devices of minor capacities, possible problems are caused with respect to relations in time between input signals and delay times caused by input capacitance and output capacitance of the level shift circuit and delay times caused by input capacitances of buffer circuits (such as the NOT circuits and the LPFs) and the driver 16 downstream. In the case of a high voltage IC having a general level shift circuit and a general floating electric potential region as shown in FIG. 13, a delay time taken in transmitting a turning-on or a turning-off signal from the load resistor circuit configured by the high voltage MOSFET 1 and the load resistor 3 or the load resistor circuit configured by the high voltage MOSFET 2 and the load resistor 4 to the driver 16 is on the order of 100 ns because of the influences of the parasitic output capacitances 51 and 52. That is, if the oscillation frequency of the IC is 1 MHz, a duty cycle of 10 percent provides an "on" period of 100 ns. Therefore, a limitation is posed in that a duty cycle of 10 percent or less for "on" and 90 percent or more for "off" cannot be set. Consequently, even if each of the high voltage MOSFETs 1 and 2 are driven according to a duty cycle where the "on" period is 4 percent or less to reduce the average power dissipation of each of the high voltage MOSFETs 1 and 2, there are occasions when no on-signal is transmitted due to transmission delay.

The level of a false signal, produced by a displacement current caused by a dV/dt surge, largely depends on the capacitance values of the parasitic output capacitances 51 and 52 of the high voltage MOSFETs 1 and 2, respectively, illustrated in FIG. 13 without being much affected by the NOT circuits, LPFs and other stray capacitances under metal wirings.

Therefore, to reduce a displacement current causing a malfunction due to a dV/dt surge while controlling the overall allowable power dissipation of the high voltage IC, reduction of the output capacitances of the high voltage MOSFETs 1 and 2 is very effective.

FIG. 14 is a plan view of a related high voltage IC. FIG. 14 depicts a level shift circuit including high voltage MOSFETs and a driving circuit provided with a floating electric potential region formed on a single semiconductor substrate. FIGS. 15A and 15B are cross sectional views each taken along the line X-X' in FIG. 14 and show a principal part of a high voltage MOSFET used in the related level shift circuit.

As depicted in FIG. 14, in the related level shift circuit, high voltage MOSFETs 11 and 11b, comprising a level shift device, are formed in a circle, at the center of which a drain $n^+$ region 103 is formed. The drain $n^+$ region 103 is connected to a drain electrode 120, and from a drain pad of the drain electrode 120 a bonding wire 201 is connected to a floating electric potential region 300 by wire bonding. The high voltage MOSFETs 11 and 11b are respectively equivalent to the high voltage MOSFETs 1 and 2 shown in FIG. 13 and are used as level shift devices each functioning as an interface between the high voltage side and the low voltage side of a high voltage IC called as a gate driver IC.

As shown in FIG. 15A, the high voltage MOSFET 11 is formed of a $p^-$-type silicon substrate 100, in a surface layer of which, an $n^-$-type region 101 is formed. In a surface layer of the $n^-$-type region 101, the drain $n^+$ region 103 of the high voltage MOSFET 11 and an n offset region 104 encompassing the drain $n^+$ region 103 are formed. In a region surrounding the periphery of the n⁻-type region 101, a p⁻ well region 102 is formed as region (region Gnd) connected to a ground GND (the COM electric potential point) and encompasses the high voltage MOSFET 11. A p base region 105 is formed between the p⁻ well region 102 and the n⁻-type region 101 and also functions as a channel region. A base pick up p⁺-region 113 and a source n⁺-region 114 of the high voltage MOSFET 11 both formed in the surface layer of the p base region 105. A gate electrode 115 of the high voltage MOSFET 11 made of, for example, polycrystalline silicon formed in the surface of the p base region 105 through a gate oxide film. A drain electrode 120 of the high voltage MOSFET 11 is connected to the drain n⁺ region 103. A source electrode 121 of the high voltage MOSFET 11 is connected to the source n⁺-region 114 and to the ground GND. A field oxide 151 formed by a Local Oxidation of Silicon (LOCOS) process, an interlayer dielectric 152 of, for example, dielectric such as Tetraethylorthosilicate (TEOS) or Boro-phospho Silicate Glass (BPSG), and a passivation film 153 of a silicon oxide film and a silicon nitride film formed by plasma chemical vapor deposition (CVD) are formed in the surface of the n⁻-type region 101.

Here, each of the regions constituting the high voltage MOSFET 11 are formed according to, for example, the following design conditions. The n⁻-type region 101 has a phosphorus surface impurity concentration of $1*10^{15}$ to $1*10^{16}/cm^3$ and a diffusion depth on the order of 7 to 10 micrometers. The n offset region 104 has a phosphorus surface impurity concentration of $1*10^{17}$ to $1*10^{18}/cm^3$ and a diffusion depth on the order of 1 to 2 micrometers. The p⁻ well region 102 has a boron surface impurity concentration of $1*10^{15}$ to $1*10^{18}/cm^3$ and a diffusion depth on the order of 10 to 13 micrometers. The p base region 105 has a boron surface impurity concentration of $1*10^{16}$ to $1*10^{19}/cm^3$ and a diffusion depth on the order of 4.0 to 5.5 micrometers.

FIG. 15A shows output capacitances (drain-source capacitance Cds) constituting large proportions of parasitic capacitances and causing possible problems when a transient increase in the drain electric potential of the high voltage MOSFET 11 occurs by a jump in the electric potential at the AC output terminal OUT due to dV/dt surge. Input capacitance components (a gate-drain capacitance Cgd and a gate-source capacitance Cgs) are omitted because they are on the order of several percent of the total parasitic capacitances. Among the output capacitances shown in FIG. 15A, the drain-source capacitance Cds includes a capacitance component Cds1 that is at the junction between the p⁻ well region 102 and the p base region 105 and the n⁻-type region 101, and a capacitance component Cds2 parasitic on the LOCOS field oxide 151 formed between the source electrode 121 that protrudes toward the drain n⁺ region 103 as a field plate on the negative electrode side, and the n⁻-type region 101 just beneath the source electrode 121. Thus, the drain-source capacitance Cds is the sum of the capacitance component Cds1 and the capacitance component Cds2 (Cds=Cds1+Cds2).

The result of a simulation of the high voltage MOSFET 11, executed using a small signal model to characterize C-V (capacitance-voltage) at an AC frequency of 1 MHz demonstrated that the drain-source capacitance Cds, when a drain electric potential is 30V, has a capacitance on the order of 0.4 pF. Moreover, among the output capacitances, the drain-substrate capacitance Cdsub is the capacitance existing at the junction of the p⁻-type silicon substrate 100 and the n⁻-type region 101. The drain-substrate capacitance Cdsub exhibits the largest proportion of the parasitic capacitance components of the high voltage MOSFET. The result of simulation of a C-V characteristic demonstrated that the drain-source capacitance Cds, when a drain electric potential is 30V, has a capacitance on the order of 1.6 pF.

Moreover, as shown in FIG. 15B, the high voltage MOSFET 11b is formed on an SOI (silicon on insulator) substrate. On the SOI substrate, the n⁻-type region 101 to be an SOI layer is formed on the p⁻-type silicon substrate 100 with a silicon oxide film 200 having a thickness of several micrometers or more provided between. The p⁻ well region 102 is formed so as to contact the silicon oxide film 200. The other regions are formed like the corresponding regions shown in FIG. 15A. Such a high voltage MOSFET 11b, like in the high voltage MOSFET 11, also has a drain-source capacitance Cds (Cds=Cds1+Cds2).

To reduce the output capacitance of the circular high voltage MOSFET 11 having a circular, planar shape, it is conceivable to reduce the area of the p-n junction between the regions with the p base region 105 connected to the Gnd (at the COM electric potential), the p⁻ well region 102 and the p⁻-type silicon substrate 100 and the n⁻-type region 101 as a drift region (voltage blocking region). By reducing the area of the p-n junction, the drain-source capacitance and the drain-substrate capacitance can be reduced. However, in general, to reduce the area of the p-n junction in a circular structure is to reduce the diameter of the circle. To reduce the diameter is to shorten the drift length Ld in a drift region (high voltage blocking region), and to reduce the drift length relates to reducing the breakdown voltage of the high voltage MOSFET 11. Therefore, for the circular high voltage MOSFET 11, the output capacitance alone is reduced while the diameter remains the same. The same problem arises with the high voltage MOSFET 11b.

In Patent Document 2, a high voltage IC is described which shares a voltage blocking structure of a high voltage MOSFET used for level shift and a voltage blocking structure of an isolation island. However, no description is presented about a high voltage IC in which a voltage blocking structure of a high voltage MOSFET and a voltage blocking structure of an isolation island are independently formed nor is description given about output capacitances.

To solve the problems above, an object of the invention is therefore to provide a high voltage transistor having high switching response speed. Moreover, a further object of the invention is to provide a driving circuit in which a power loss and occurrence of malfunctions are reduced.

Solution to Problem

To solve the problems above and achieve the above objects, in a high voltage, semiconductor device and a driving circuit according to the invention, two or more voltage blocking regions of n⁻-type regions as drift regions of the high voltage transistor are separately formed with p⁻-region provided between the respective n⁻-type regions. Moreover, a drain diffused region with a high impurity concentration is formed in one n⁻-type region, while the other or the rest of the n⁻-type regions made to be at floating electric potentials. The drain diffused region is connected to high electric potential wiring.

Advantageous Effects of Invention

According to the high voltage, semiconductor device and driving device of the invention, a high voltage transistor with a high switching response speed can be provided. Furthermore, a driving circuit with reduced power loss and occurrence of malfunctions can be provided.

The use of the structure according to the invention, when the area of the circular voltage blocking region, for example, becomes an area that allows to drive a current exceeding the current driving capability required for a high voltage MOSFET to ensure its high voltage blocking capability, enables parasitic capacitance components to be made ineffective in voltage blocking regions other than the region where a current must be driven by required current driving capability. This can reduce the output capacitance of the high voltage MOSFET at a low cost. Therefore, the use of the high voltage MOSFET in a level shift circuit enables a displacement current at an occurrence of a dV/dt surge to be made small.

Moreover, by reducing an output capacitance of a high voltage MOSFET, when an on-signal is input to the gate of the high voltage MOSFET, the discharge of the output capacitance can be made quickened. Furthermore, when the high voltage MOSFET is used in a level shift circuit, the length of a transmission delay of a signal at turning-on or turning-off in a high electric potential side driving circuit can be shortened. With the transmission delay of a signal thus shortened, the on-duty time in periodic on-off driving of the high voltage MOSFET can be also set to be short to allow the resistance value of a load resistor for level-shifting to also be small. As a result, while power loss in a level shift circuit is reduced, both a displacement current and a load resistance at the occurrence of a dV/dt surge become small, by which the voltage drop in a load resistance section becomes small to enable realization of a driving circuit less susceptible to malfunction due to a dV/dt surge.

DESCRIPTION OF EMBODIMENTS

Embodiments of a high voltage semiconductor device and driving circuit according to the invention will be explained with reference to the attached drawings. The drawings are schematic and relations between thickness and horizontal dimension, and relative thicknesses of layers shown in each of the drawings differ from actual dimensions. Therefore, the specific thicknesses and dimensions must be determined based on the following explanations. Moreover, relative dimensions and proportions of identical elements among the drawings may, of course, differ.

In the specification and the attached drawings, a head character "n" or "p" appended to names of layers and regions indicates that the major carriers in the layers and the regions are electrons or holes, respectively. Moreover, a sign "+" or "−" appended to the head character "n" or "p" indicates that impurity concentration in the layer or the region is higher or lower than that in the layer or the region with a name having the head character "n" or "p" without the sign.

In the following embodiments, those using silicon (Si) substrates as semiconductor substrates are explained. However, with the use of semiconductor substrates other than silicon substrates such as silicon carbide (SiC) and gallium nitride (GaN), the same effect can be achieved.

First Embodiment

Figure 1A:
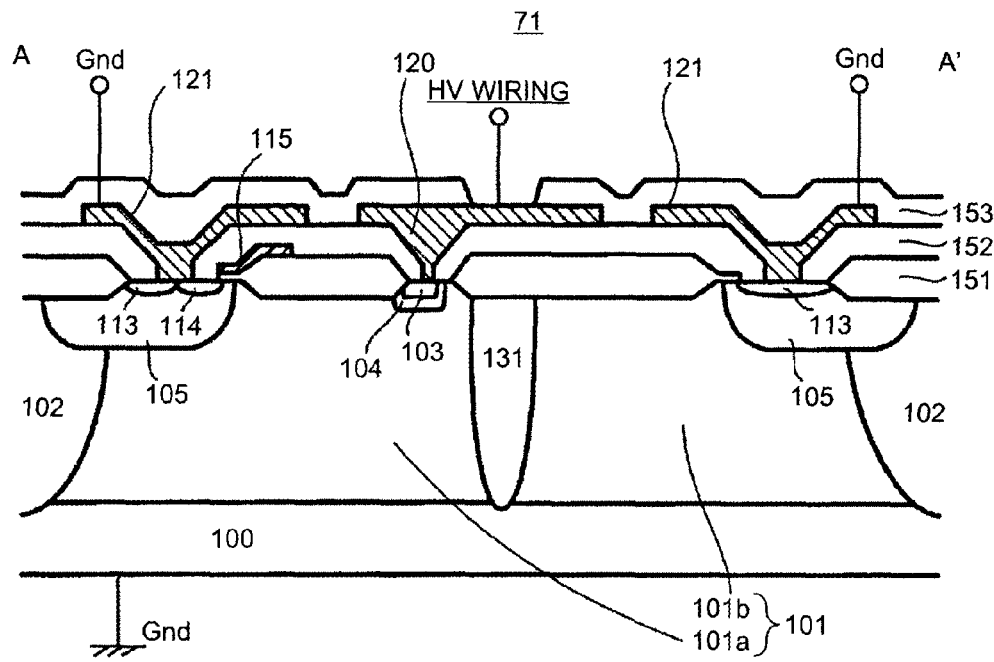
FIG. 1A is a cross sectional view of a principal part of a high voltage MOSFET according to a first embodiment of the invention.
Figure 1B:
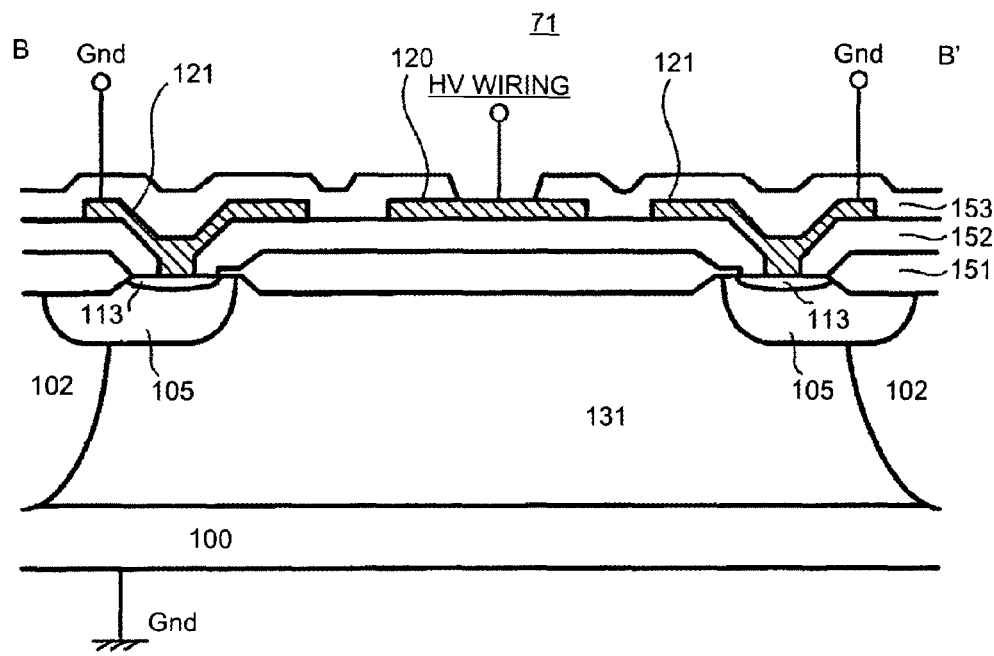
FIG. 1B is a cross sectional view of a principal part of a high voltage MOSFET according to the first embodiment.
Figure 2:
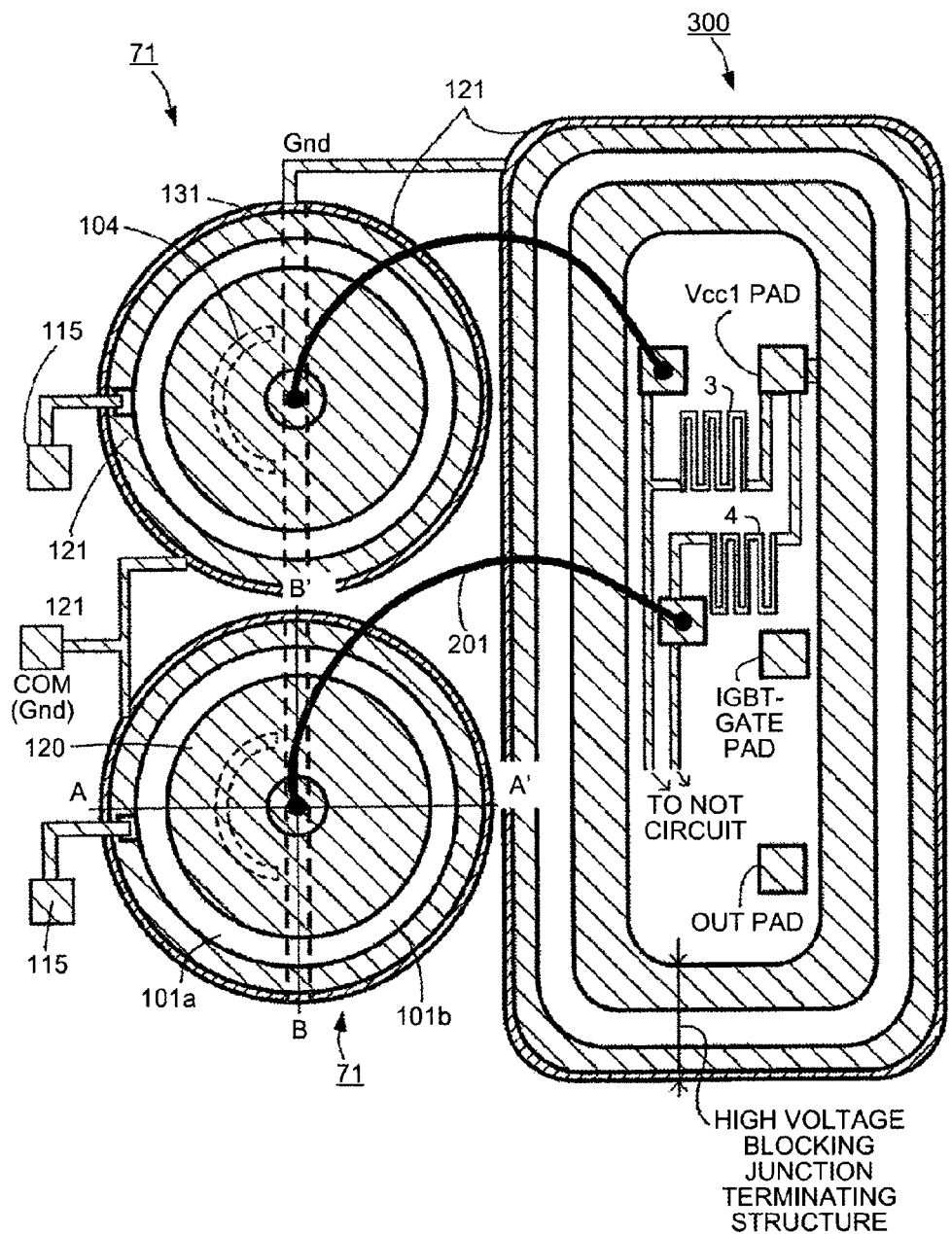
FIG. 2 is a plan view of a principal part of a high voltage IC according to the invention.

A first embodiment will be explained with reference to FIG. 1A to FIG. 5, and FIG. 13. FIGS. 1A and 1B are cross sectional views of a principal part of a high voltage MOSFET according to the first embodiment of the invention. FIG. 2 is a plan view of a principal part of a high voltage IC according to the invention. In FIG. 2, a level shift circuit including the high voltage MOSFET and a driving circuit equipped with a floating electric potential region are formed on a single semiconductor substrate (hereinafter, for FIGS. 6 and 9A as well). A cross sectional view taken along line A-A' in FIG. 2 corresponds to the cross sectional view shown in FIG. 1A and a cross sectional view taken along line B-B' in FIG. 2 corresponds to the cross sectional view shown in FIG. 1B. In FIG. 2, of semiconductor regions in a high voltage MOSFET 71, only an n offset region 104 and a p$^-$-region 131 are shown by broken lines.

Figure 13:
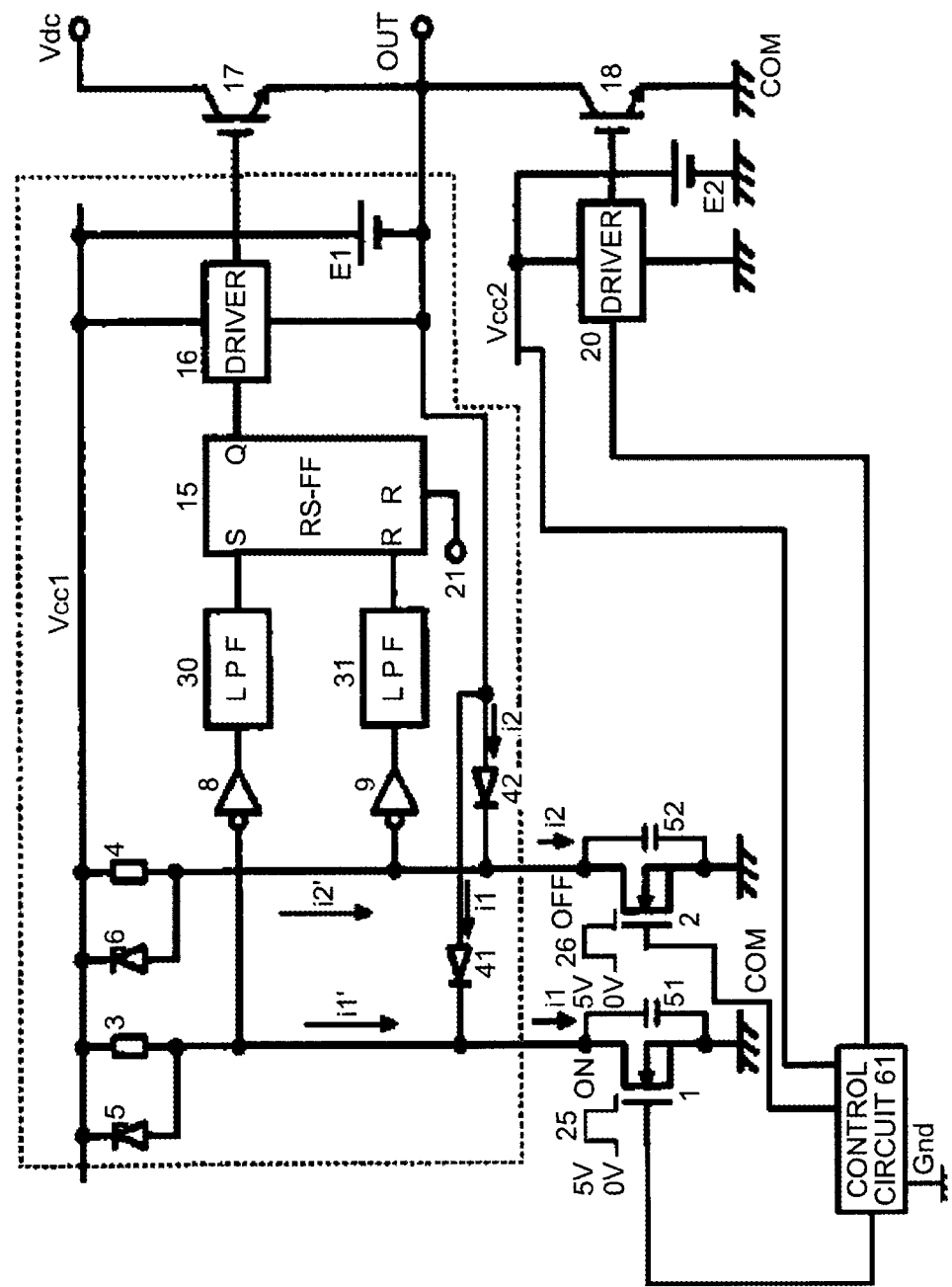
FIG. 13 is a circuit diagram of a high voltage IC having an ordinary level shift circuit.
Figure 14:
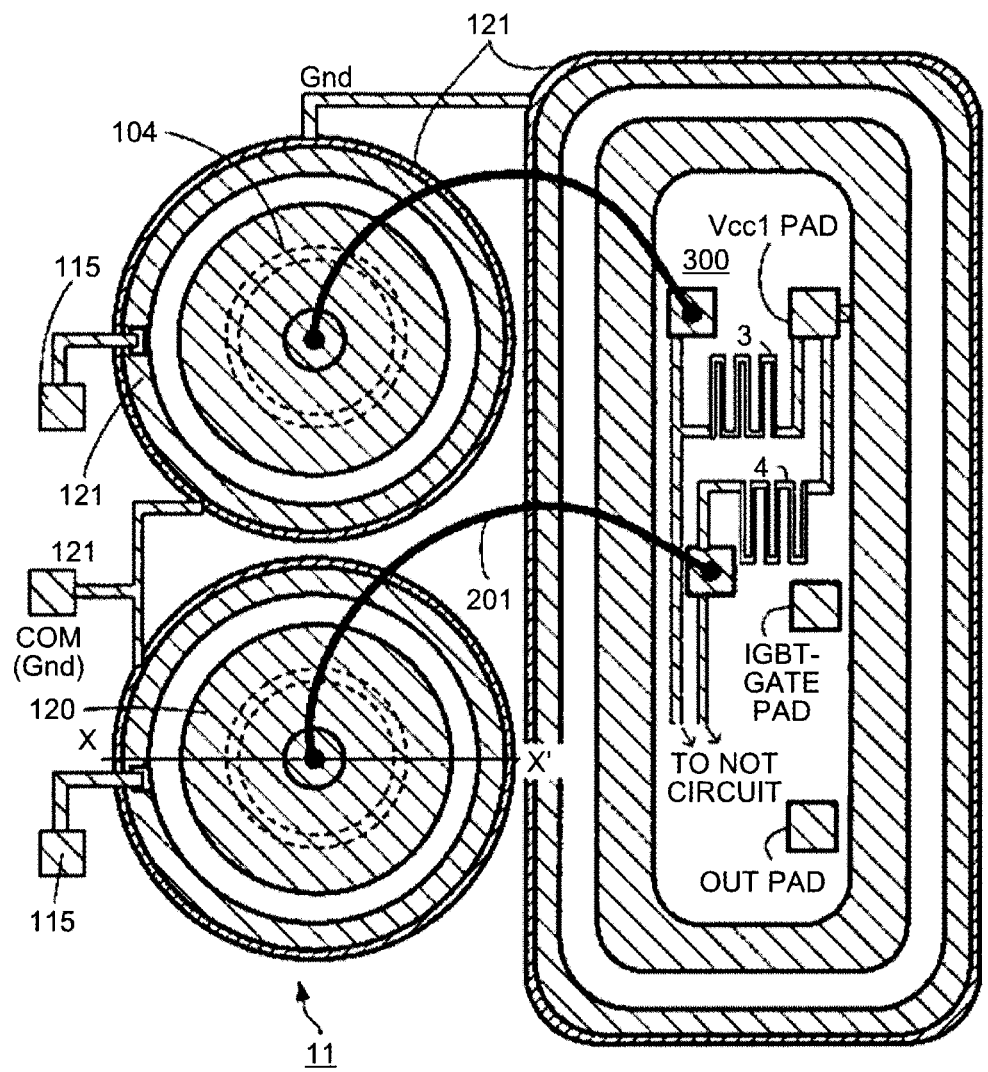
FIG. 14 is a plan view of a principal part of a related high voltage IC.
Figure 15A:
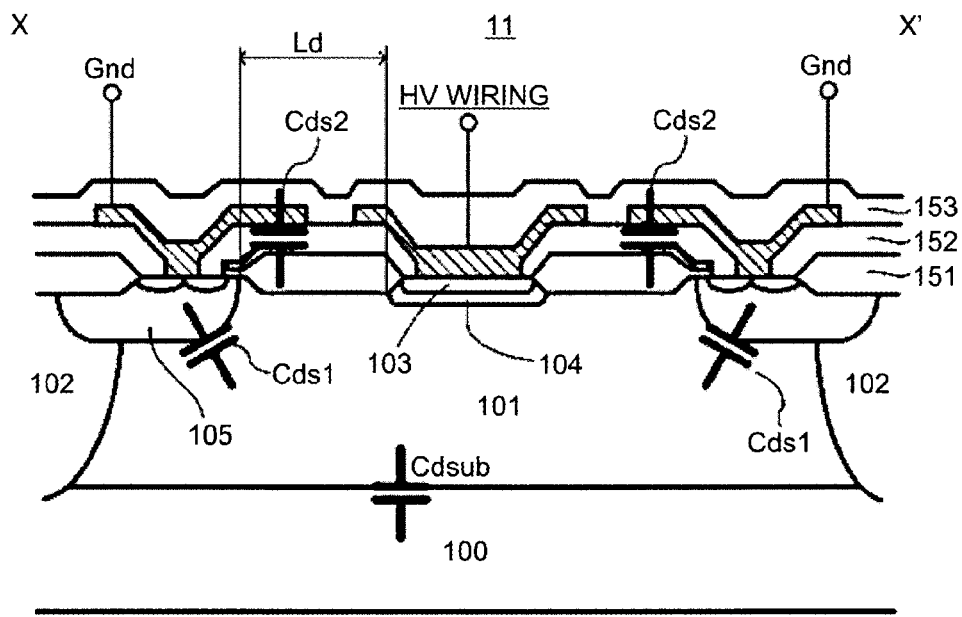
FIG. 15A is a cross sectional view taken along line X-X' in FIG. 14.
Figure 15B:
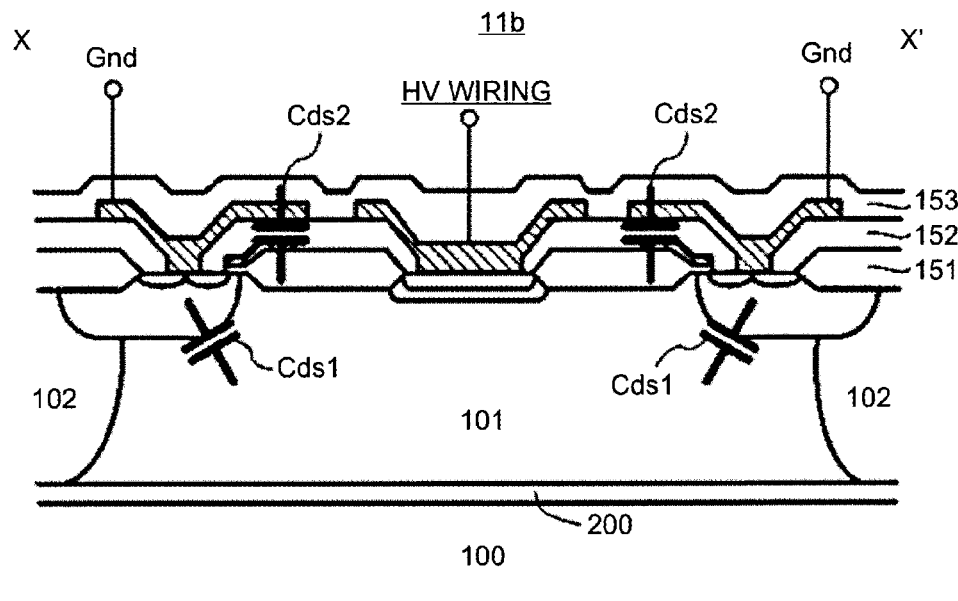
FIG. 15B is a cross sectional view taken along line X-X' in FIG. 14.

The high voltage MOSFETs 71 shown in FIGS. 1A and 1B correspond to the high voltage MOSFETs 1 and 2 shown in FIG. 13. Further, the high voltage MOSFETs 71 have a circular shape (see FIG. 2). A floating electric potential region 300 shown in FIG. 2 corresponds to the region encompassed by the dotted line shown in FIG. 13 and is provided with corresponding components, with the exception of the auxiliary DC power supply E1. The floating electric potential region 300 includes components such as the gate driver of the output switching device (IGBT 17) in the upper arm. In the floating electric potential region 300 shown in FIG. 2, only the load resistors 3 and 4 in the circuit shown in FIG. 13 are shown. Further, in the floating electric potential region 300, the Vcc1 pad shown in FIG. 2 is connected by wiring to the positive electrode side of the auxiliary DC power supply E1 shown in FIG. 13. An IGBT-GATE pad is connected by wiring to the gate of the IGBT 17, which is connected between the positive electrode side terminal Vdc of a main DC power supply and the AC output terminal OUT shown in FIG. 13. An OUT pad is connected by wiring to the AC output terminal OUT shown in FIG. 13 and the negative electrode side of the auxiliary DC power supply E1 (not shown). Moreover, a high voltage blocking junction terminating structure is formed so as to encompass the floating electric potential region 300. The high voltage IC shown in FIG. 2 is a driving circuit of the IGBT 17 shown in FIG. 13.

As shown in FIGS. 1A and 1B, the MOSFET 71 includes the following regions. An n$^-$-type region 101 selectively formed in the surface layer of a p$^-$-type silicon substrate 100, by ion implantation and diffusion, for example (hereinafter, the same is true for other regions provided in the n$^-$-type region 101). The n$^-$-type region 101, for example, may have a phosphorus surface concentration of $1*10^{15}$ to $1*10^{16}/cm^3$ and a thickness on the order of 7 to 10 micrometers.

In a periphery of the n$^-$-type region 101, a p$^-$ well region 102 passes through the n$^-$-type region 101 to the p$^-$-type silicon substrate 100. The p$^-$ well region 102 encompasses other regions provided in the n$^-$-type region 101, is a ground region Gnd connected to the ground GND and is further a separating region separating the high voltage MOSFET 71 and other elements. The p$^-$ well region 102, for example, may have a boron impurity surface concentration of $1*10^{15}$ to $1*10^{18}/cm^3$ and a diffusion depth on the order of 10 to 13 micrometers.

A p$^-$-region 131 is selectively formed passing through the n$^-$-type region 101 to the p$^-$-type silicon substrate 100. The p$^-$-region 131 extends from one p$^-$ well region 102 to another p$^-$ well region 102 so as to pass through a center portion of the circular-shaped the n$^-$-type region 101 and the p$^-$-region 131 contacts the p$^-$-type silicon substrate 100, dividing the n$^-$-type region 101 into 2 (hereinafter, n$^-$-type region 101a and 101b). In other words, the p$^-$-region 131 passes through, for example, a central portion of the high voltage MOSFET 71 having a circular-shape and from the perspective of a planar view, has a linear-shape, the distal ends of which alone contact the p$^-$ well region 102 (see FIGS. 1B and 2), i.e., exclusive of the distal ends, the p$^-$-region 131 is isolated from the p$^-$ well region 102 (see FIG. 1A). The p$^-$-region 131, for example, may have a p-type impurity (such as boron) surface concentration of $1*10^{15}$ to $1*10^{17}/cm^3$ and a diffusion depth on the order of 10 to 13 micrometers.

A p base region 105 is selectively formed in the surface layer of the n$^-$-type region 101, between the p$^-$ well region 102 and the n$^-$-type region 101. The p base region 105 contacts the p$^-$ well region 102 and further functions as a channel region. The p base region 105, for example, may have a boron impurity surface concentration of $1*10^{16}$ to $1*10^{19}/cm^3$ and a thickness on the order of 4.0 to 5.5 micrometers.

A base pick up p$^+$-region 113 and a source n$^+$-region 114 of the high voltage MOSFET 71 are selectively formed in the surface of the p base region 105. The source n$^+$-region 114 is formed only in the p base region 105 that is formed in the n$^-$-type region 101a (see FIGS. 1A and 2). Further, the source n$^+$-region 114 is formed so as not to contact the p$^-$-region 131 (see FIG. 2).

A drain n$^+$-region 103 of the high voltage MOSFET 71 is selectively formed in the surface layer of the n$^-$-type region 101 so as not to contact the p$^-$-region 131. Further, the drain n$^+$-region 103 is formed only in the n$^-$-type region 101a (see FIGS. 1A and 2) and from the perspective of a planar view, has a circular-shape (see FIG. 2).

An n offset region 104 encompasses the drain n$^+$-region 103 and covers a region beneath the drain n$^+$-region 103. Further, the n offset region 104 is formed to so as to not contact the n$^-$-region 101b, i.e., is formed in only the n$^-$-type region 101a (see FIGS. 1A and 2). The n offset region 104, for example, may have a phosphorus impurity surface concentration of $1*10^{17}$ to $1*10^{18}/cm^3$ and a thickness on the order of 1 to 2 micrometers.

A field oxide film 151 is formed in the surface of the n$^-$-type region 101a, between the source n$^+$-region 114 and the drain n$^+$-region 103, by LOCOS processing. Similarly, in the surface of the n$^-$-type region 101b, a field oxide film 151 is formed between the n offset region 104 and the base pick up pt-region 113.

A gate electrode 115 of the high voltage MOSFET 71, which is formed of, for example, polycrystalline silicon, is formed in the surface of the p base region 105 with a gate oxide film provided therebetween. The gate electrode extends along the top of the field oxide film 151 and is formed so as not to protrude above the p$^-$-region 131.

A drain electrode 120 of the high voltage MOSFET 71 is connected to the drain n$^+$-region 103 and formed so as not to contact the p$^-$-region 131 by an interlayer dielectric film 152 of TEOS, BPSG, etc. The drain electrode 120, for example, is connected to high voltage (HV) wiring by a bonding wire 201. A source electrode 121 of the high voltage MOSFET 71 connected to the base pick up pt-region 113 and the source n$^+$-region 114 and is electrically connected to the ground GND. The surface of the high voltage MOSFET 71, on which the above elements are formed, is covered by passivation film 153 of a silicon oxide film and a silicon nitride film formed by plasma CVD.

The ground GND (COM electric potential point) explained above is, as shown in FIG. 13, a common electric potential common to the negative electrode side of the main DC power supply whose voltage is applied across the IGBTs 17 and 18 as the output switching devices, the negative electrode side of the auxiliary DC power supply E2, the negative electrode side of the driver 20 and the negative electrode sides of the high voltage MOSFETs 1 and 2.

Figure 16:
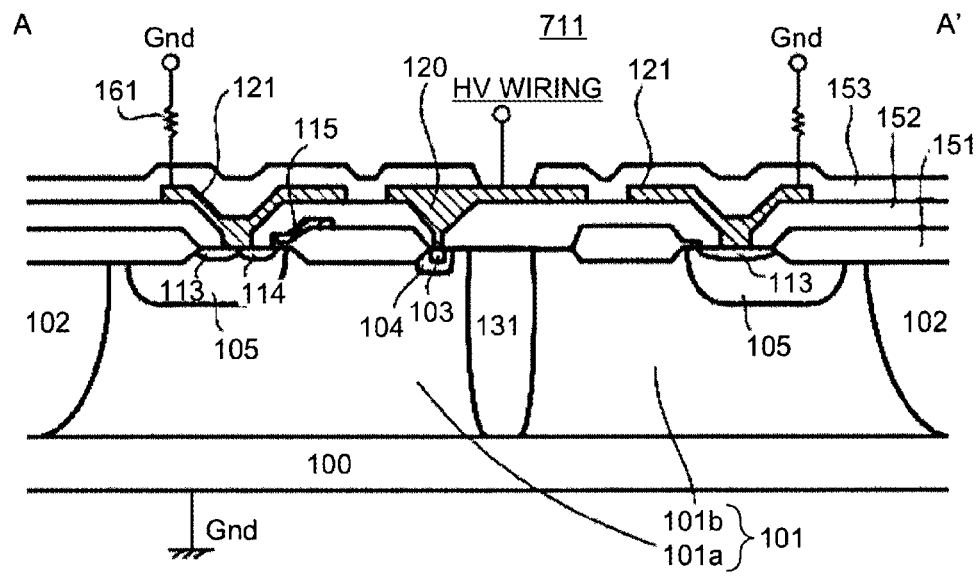
FIG. 16 is a cross sectional view showing a principal part of a high voltage MOSFET as another example of the first embodiment.

FIG. 16 is a cross sectional view of another example of the principal part of the high voltage MOSFET according to the first embodiment. Similar to a high voltage MOSFET 711 shown in FIG. 16, a load resistor 161 may be provided between the source electrode 121 and the ground (COM electric potential point). In the high voltage MOSFET 711 shown in FIG. 16, the p-base region 105 and the p⁻ well region 102 are separated from each other, a contact layer (not shown) is formed in the surface layer of the p⁻ well region 102, the electric potential of an electrode (not shown) connected to the contact layer is formed, and the electrode is regarded as the ground potential.

Furthermore, the p⁻-region 131 dividing the n⁻-type region 101 into two can be also formed simultaneously with the p⁻ well region 102 to reduce the number of manufacturing process steps. As explained, among the two regions divided by the p⁻-region 131, the n⁻-type region 101a is provided with the source n⁺-region 114, the drain n⁺-region 103, and the gate electrode 115. The source electrode 121 is connected to the source n⁺-region 114 and the drain electrode 120 is connected to the drain n⁺-region 103. With respect to the other n⁻-type region 101b, the electric potential thereof is not fixed and is a floating electric potential. Above the n⁻-type region 101b, the drain electrode 120 is formed extending as a field plate through insulating films such as the LOCOS field oxide 151 and the interlayer dielectric 152. In this example, although the field plate is formed by extending the drain electrode 120, the field plate may be formed as a layer different from the drain electrode 120 and connected to the drain electrode 120. The field plate is similarly formed also above the n⁻-type region 101a so that the distance from the source electrode 121 becomes equivalent, by which a local concentration of electric field is suppressed.

Preferably, the p base region 105 and the p⁻ well region 102 are continuously joined around the outermost periphery of the high voltage MOSFET 71 having a circular planar shape (see FIG. 2). In other words, the p base region 105 and the p⁻ well region 102 each preferably have a circular planar shape, where the p⁻ well region 102 preferably covers the p base region 105 and the n⁻-type region 101. Furthermore, the p⁻-type silicon substrate 100 is also connected to the ground GND (COM electric potential point) via connection to the p⁻ well region 102 having the common electric potential. On the posterior surface of the p⁻-type silicon substrate 100, an electrode may be formed to which the ground GND is connected. In the present embodiment, explanation is given for a case where the n⁻-type region 101 is formed by selective diffusion from the anterior surface of the p⁻-type silicon substrate 100 and the p⁻ well region 102 is formed by diffusion so as to encompass the n⁻-type region 101.

Figure 3A:
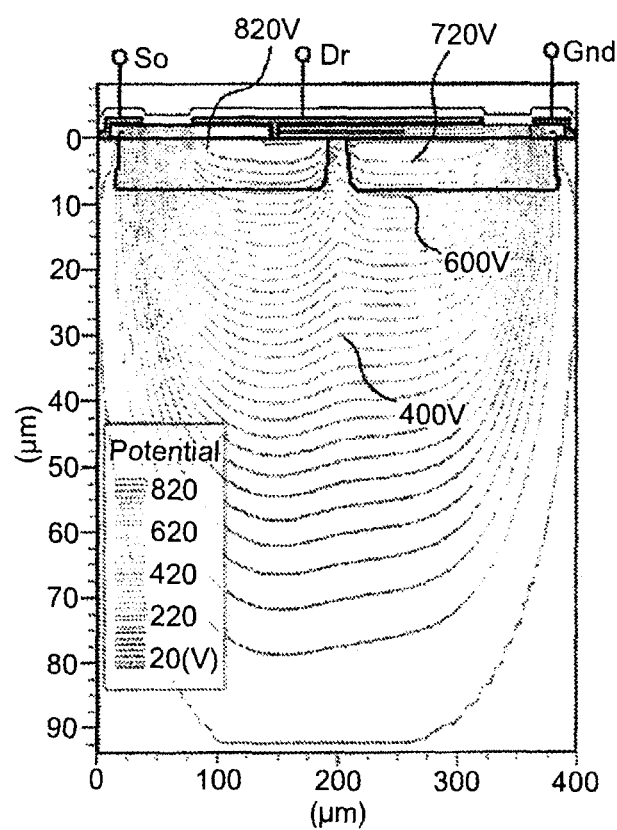
FIG. 3A is a diagram of voltage characteristic evaluation results for the high voltage MOSFET according to the first embodiment.
Figure 3B:
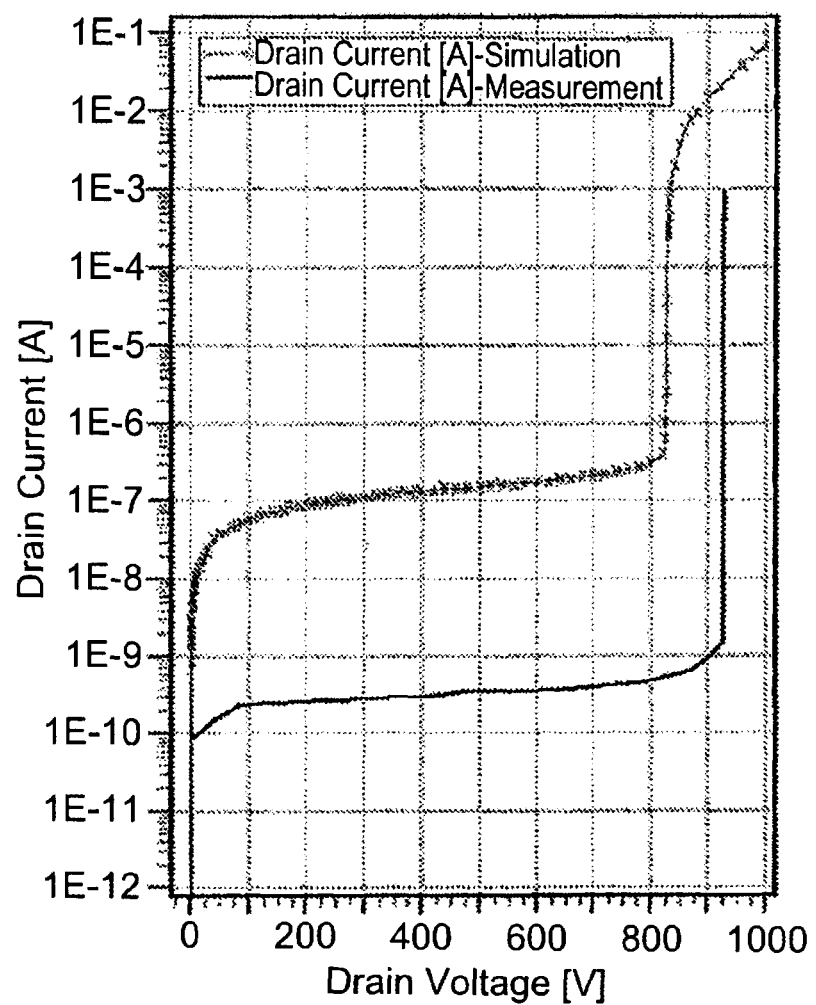
FIG. 3B is a diagram of voltage characteristic evaluation results for the high voltage MOSFET according to the first embodiment.
Figure 4A:
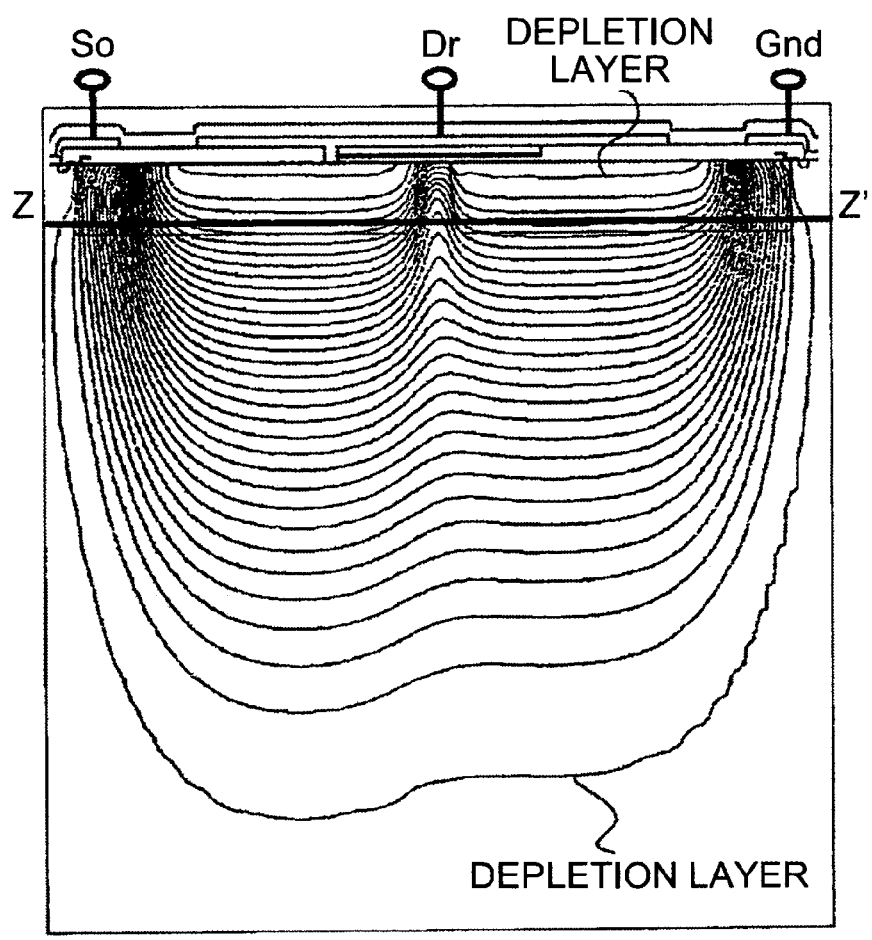
FIG. 4A is a diagram of voltage characteristic evaluation results for the high voltage MOSFET according to the first embodiment.
Figure 4B:
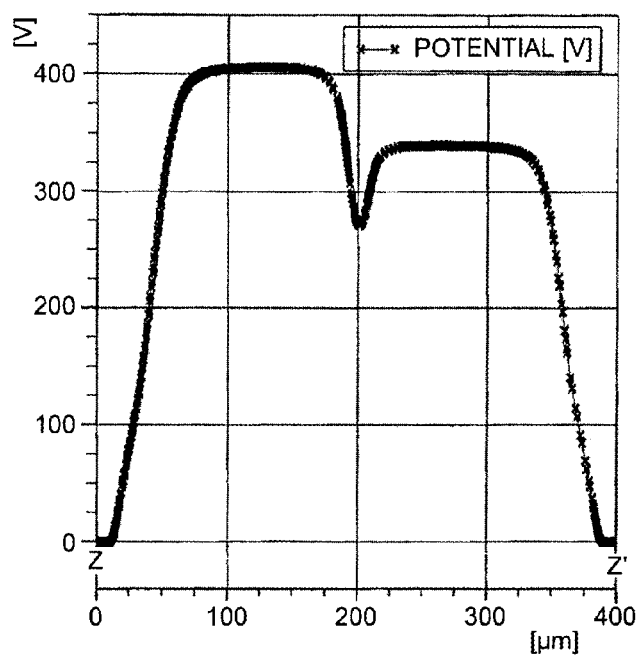
FIG. 4B is a diagram of voltage characteristic evaluation results for the high voltage MOSFET according to the first embodiment.

Since such a structure may change the electric potential distribution around the p⁻-region 131, it was ascertained whether the structure affects the voltage blocking characteristic of the high voltage MOSFET 71. FIGS. 3A, 3B, 4A, and 4B are diagrams showing evaluation results for voltage blocking characteristics of the high voltage MOSFET 71. FIG. 3A is a diagram showing electric potential distributions when the drain electric potential is 820V and the p⁻-type silicon substrate 100, the p⁻ well region 102 and the p base region 105 are connected to the ground GND. FIG. 3B is a diagram showing voltage waveforms (Drain Current (A)-Simulation) of the high voltage MOSFET 71 obtained by simulation and voltage waveforms obtained by measurement (Drain Current (A)-Measurement). FIG. 4A is a diagram showing electric potential distributions when the drain electric potential is 440V and FIG. 4B is a diagram showing an electric potential distribution on the plane taken along the line Z-Z' in FIG. 4A.

The device simulations were carried out under conditions in which a high resistance substrate with an impurity concentration of boron on the order of $1*10^{14}/cm^3$ was used for the p⁻-type silicon substrate 100. The n⁻-type region 101 had an impurity concentration of phosphorus of $3*10^{15}/cm^3$ and a diffusion depth on the order of 7 micrometers. The p⁻ well region 102 had an impurity concentration of boron on the order of $1*10^{17}/cm^3$ and a diffusion depth on the order of 10 micrometers. The p⁻-region 131 had an impurity concentration of boron on the order of $6*10^{15}/cm^3$ and a diffusion depth on the order of 10 micrometers. Here, the radius of the n⁻-type region 101 as a drift region was determined to be on the order of 100 micrometers and the width of the p⁻-region 131 dividing the n⁻-type region 101 was determined to be 10 micrometers (dividing width).

As shown in FIG. 4A, when the drain electric potential is set at 440V, in the p⁻-region 131 provided between the n⁻-type region 101a and the n⁻-type region 101b, depletion layers extending from junctions on both sides of the p⁻-region 131 are joined to each other to make the bottom of the p⁻-region 131 provided as a depletion region. Moreover, as indicated by FIG. 4B, a diagram showing an electric potential distribution on the plane taken along the line Z-Z' in FIG. 4A, the electric potential in the p⁻-region 131 is raised from the ground GND (COM electric potential point) to an intermediate electric potential on the order of 270 to 380V. Further, in the n⁻-type region 101b, by the presence of the field plate extending above the region, there extends a region at an electric potential on the order of 340 to 380V as an intermediate electric potential of the p⁻-region 131, by which an electric potential lines from 0v to 380V are shared by the p-n junction of the p base region 105 and the n⁻-type region 101b to provide a gradual electric potential distribution. In the n⁻-type region 101a, like in the related circular high voltage MOSFET, the p-n junction between the p base region 105 including the source region and the n⁻-type region 101a (drift region) bears electric potential distributing from 0V to 440V. In this case, the p base region 105 and the n⁻-type region 101a share the electric potential with surface electric field strength being reduced by the field plates protruded from the source side and the drain side. The drift length in this case is on the order of from 100 to 130 micrometers and the width of the p⁻-region 131 is desirably on the order of from 5 μm to 15 μm. From the measured voltage blocking characteristic of the high voltage MOSFET structure according to the invention shown in FIG. 3B, it is known that the breakdown voltage of the MOSFET is of the order of 950V.

Like the voltage blocking structure according to the invention, even though the n⁻-type region 101 is divided into the n⁻-type region 101a and the n⁻-type region 101b with the electric potential of the n⁻-type region 101b brought into a floating electric potential, the structure is formed so that depletion layers, expanding from the p-n junction formed by the p⁻-region 131 and the n⁻-type region 101a and from the p-n junction formed by the p⁻-region 131 and the n⁻-type region 101b, join before avalanche breakdowns occur at the p-n junctions exerts no adverse effect on a voltage blocking characteristic.

Figure 5:
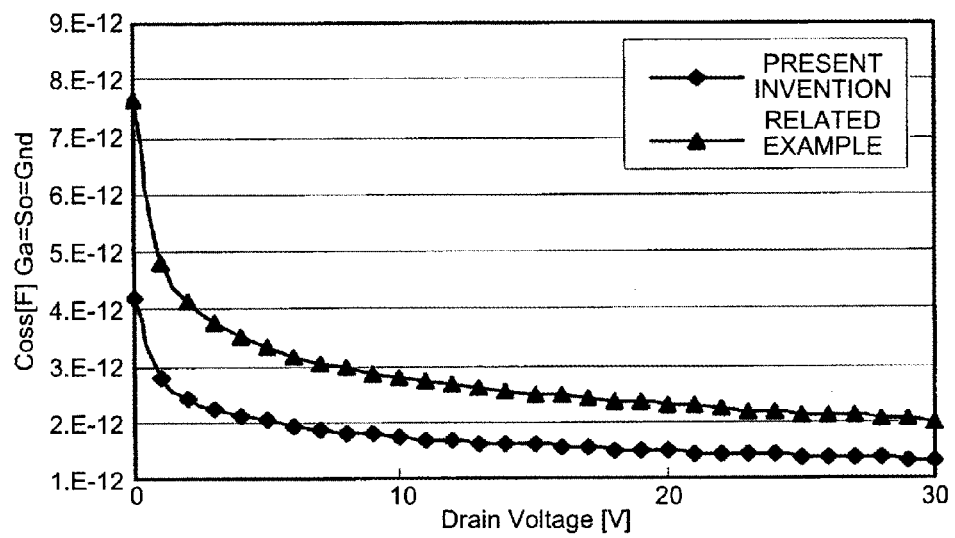
FIG. 5 is a diagram of C-V characteristics of the high voltage MOSFET according to the first embodiment.

FIG. 5 is a diagram of C-V characteristics of the high voltage MOSFET according to the first embodiment. In FIG. 5, the capacitance-voltage (C-V) characteristics of the high voltage MOSFET structure according to the invention obtained by using a small AC signal with a frequency of 1 MHz and the C-V characteristics of a related high voltage MOSFET structure obtained by using the same small AC signal are compared. Dimensions of the MOSFET structures are the same as those of the MOSFET structure with respect to which device simulations were carried out with the results shown in FIGS. 3A and 3B. Drain voltage shown on the horizontal axis is within a range from 0V to 30V and on the vertical axis is output capacitance (Coss=Cds (drain-source capacitance)+Cdsub (drain-substrate capacitance)) when a voltage is applied to the drain terminal with the gate terminal and the source terminal short circuited to be fixed at the Gnd electric potential. From the results shown in FIG. 5, over the full range of the drain voltage, the output capacitance of the high voltage MOSFET according to the invention becomes lower than that of the related high voltage MOSFET by the order of 40 percent. This is because the n⁻-type region 101 in the high voltage MOSFET 71 according to the invention is divided into the n⁻-type region 101a and the n⁻-type region 101b by the p⁻-region 131 and the electric potential of the n⁻-type region 101b is brought to the floating electric potential. The section at the floating electric potential becomes no capacitance component from the drain terminal to the source terminal. Therefore, the Cds and the Cdsub can be reduced according to the area of the n⁻-type region 101b.

Here, in the high voltage MOSFET 71 according to the invention, the p⁻-region 131 dividing the n⁻-type region 101 causes a reduction in the effective channel width that makes the high voltage MOSFET 71 function as a MOSFET. Therefore, the on-current may become lower than that in the related high voltage MOSFET. With respect to this, in the p base region 105 as a channel region, by adjusting the surface impurity concentration or the channel length (the distance between the source n⁺-region 114 and the n⁻-type region 101a), the current driving capability can be easily adjusted. Thus, by reducing the surface impurity concentration of the p base region 105 by an amount equivalent to the reduced effective channel width to set the threshold voltage Vth of the high voltage MOSFET 71 lower, a drain saturation current with the targeted value can be obtained.

In the foregoing, explanations were made with respect to a case in which the n⁻-type region 101 was formed by impurity diffusion. The n⁻-type region 101, however, can be formed by carrying out epitaxial growth on the p⁻-type silicon substrate 100. In this case, the impurity concentration in the n⁻-type region 101 may be from $1*10^{14}/cm^3$ to $1*10^{16}/cm^3$. In the following embodiments, exclusive of a sixth embodiment, even if the n⁻-type region 101 formed with a diffused region is similarly substituted by a region formed by carrying out epitaxial growth, the same advantages can be obtained.

Figure 17:
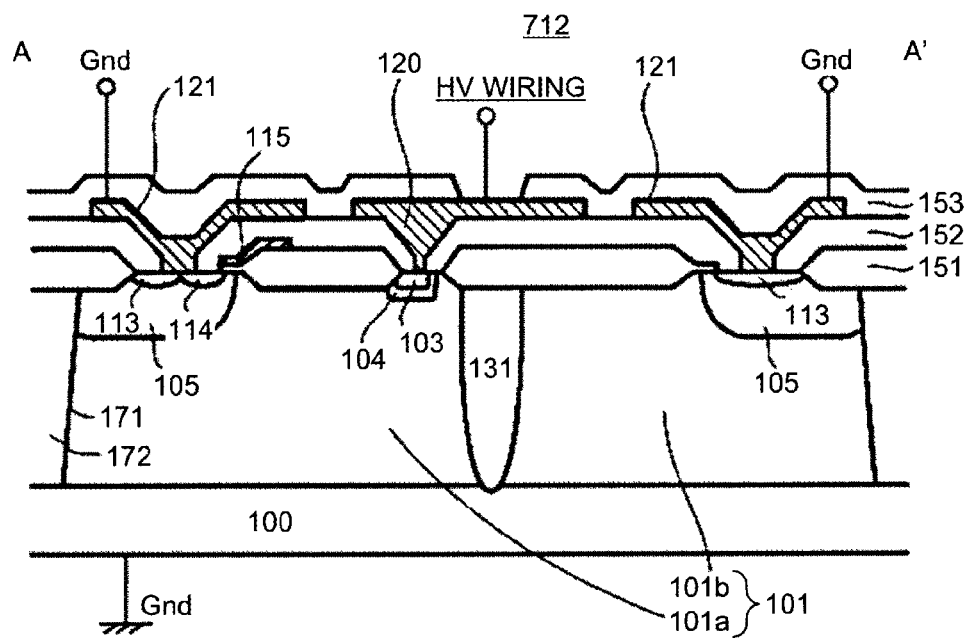
FIG. 17 is cross sectional view showing a principal part of a high voltage MOSFET as yet another example of the first embodiment.

FIG. 17 is cross sectional view showing a principal part of a high voltage MOSFET as yet another example of the first embodiment. Like a high voltage MOSFET 712 shown in FIG. 17, the separating region can be provided, instead of the p⁻ well region 102 shown in FIGS. 1A and 1B, with a trench 171 formed from the surface of the p⁻-type silicon substrate 100 and an insulating film 172 of a material such as a silicon oxide film embedded in the trench 171.

The first embodiment was explained with respect to a case in which the high voltage MOSFET 71 is an n-channel type MOSFET. The high voltage MOSFET 71, however, can be implemented as a p-channel MOSFET only by exchanging the polarity between the n-type and the p-type, and the MOSFET is not limited to an n-channel type MOSFET. The same is true in the following explanations in which both of n-type MOSFETs and P-type MOSFETs are included.

As explained, according to the first embodiment, the n⁻-type region 101 is divided into 2 by the p⁻-region 131, where the n⁻-type region 101a functioning as an MOSFET and the n⁻-type region 101b having a floating electric potential are formed. Therefore, the drain-source capacitance Cds and the drain-substrate capacitance Cdsub can be lowered. Consequently, the switching response speed can be increased as compared the conventional art. Further, at the connection point of the load resistor 3 and the high voltage MOSFET 1 and at the connection point of the load resistor 4 and the high voltage MOSFET 2, abnormal voltage drops can be prevented. Thus, errant operation of the high voltage IC (driving circuit) can be controlled. Further, by the n⁻-type region 101a (drift region) and the PN junction between the p base region 105 including the source region, and the PN junction between the p base region 105 and the n⁻-type region 101b, the electric field according to the n⁻-type region 101 becomes gradual, thereby enabling electrical power loss of the high voltage MOSFET 71 to be suppressed.

Second Embodiment

Figure 6:
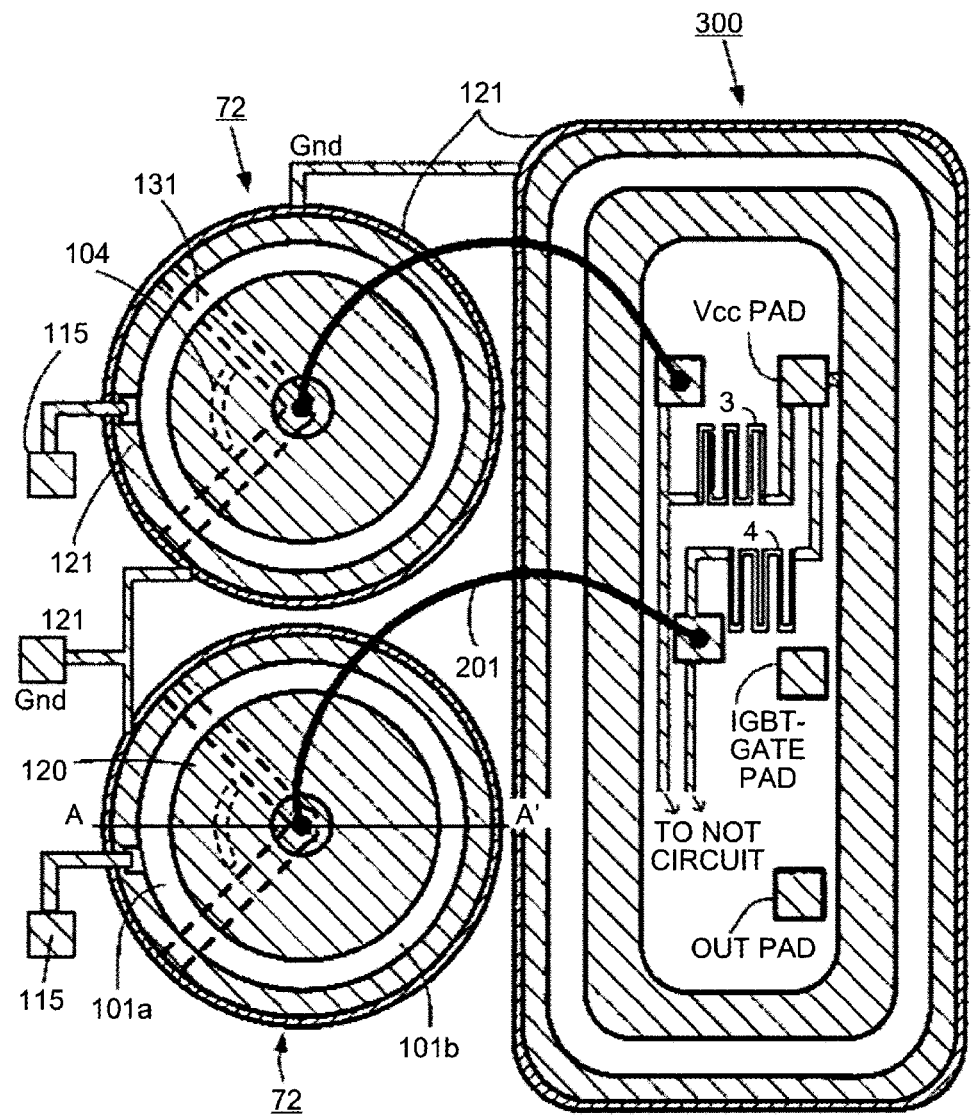
FIG. 6 is a plan view of a principal part of the high voltage IC according to a second embodiment of the invention.

FIG. 6 is a plan view showing a principal part of a high voltage IC according to a second embodiment of the invention. A cross sectional view taken along line A-A' in FIG. 6 is the same as the cross sectional view of the first embodiment shown in FIG. 1A.

As shown in FIG. 6, a high voltage MOSFET 72 differs from the high voltage MOSFET 71 shown in FIG. 2 in that the plane figure of the p⁻-region 131 is formed into a V-shape. With the n⁻-type region 101 divided by the V-shaped p⁻-region 131 in this way, the area of the section functioning as a MOSFET becomes approximately one-fourth of the area of the corresponding section of the related MOSFET. This can reduce a parasitic output capacitance in the high voltage MOSFET 72 by 60 percent up to a maximum of the order of 75 percent compared with that of the example of a related high voltage MOSFET.

As explained, according to the second embodiment, the effects of the first embodiment can be achieved.

Third Embodiment

Figure 7:
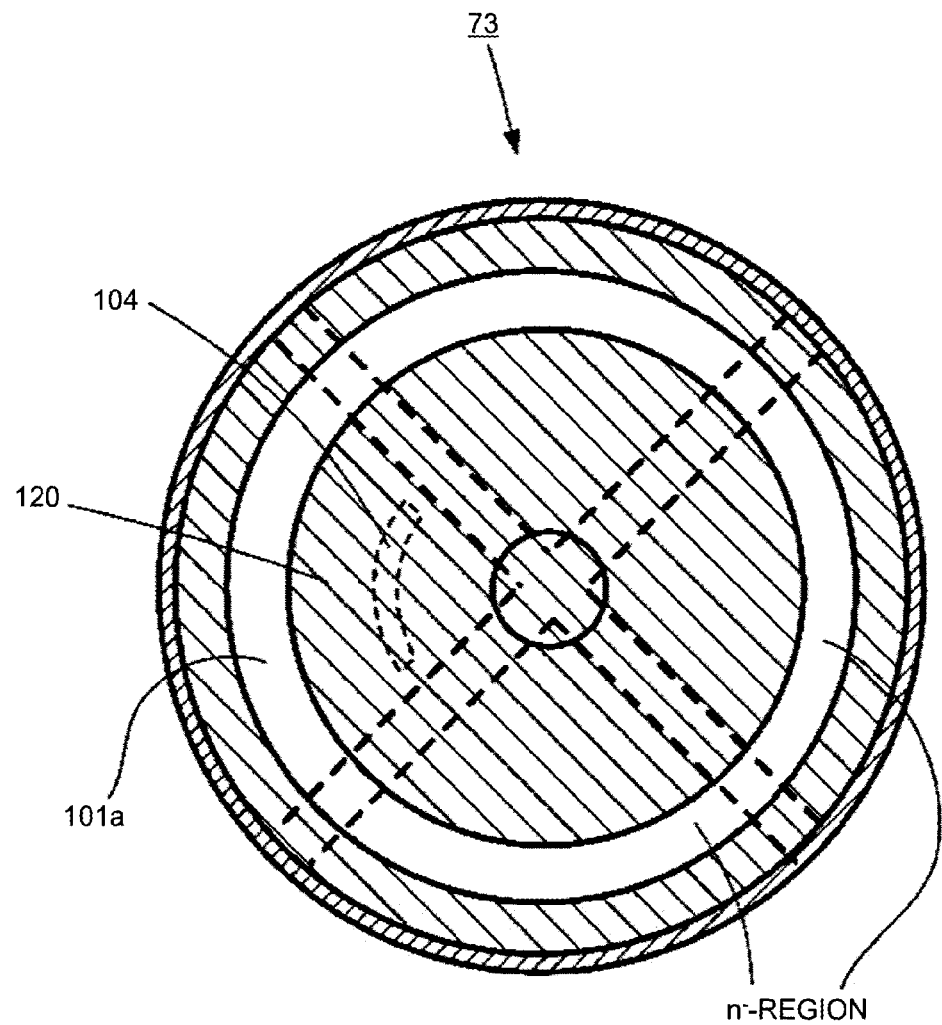
FIG. 7 is a plan view of a principal part of the high voltage MOSFET according to a third embodiment of the invention.

FIG. 7 is a plan view showing a principal part of the high voltage MOSFET 73 according to a third embodiment of the invention. A high voltage MOSFET 73 differs from the high voltage MOSFET 72 shown in FIG. 6 in that the n⁻-type region 101b (a region at a floating electric potential) divided by the p⁻-region 131 is formed of a plural sections. In this way, the region divided by the p⁻-region 131 is not necessarily one region but can be formed of a plural regions.

As explained, according to the third embodiment, the effects of the first embodiment can be achieved.

Fourth Embodiment

Figure 8A:
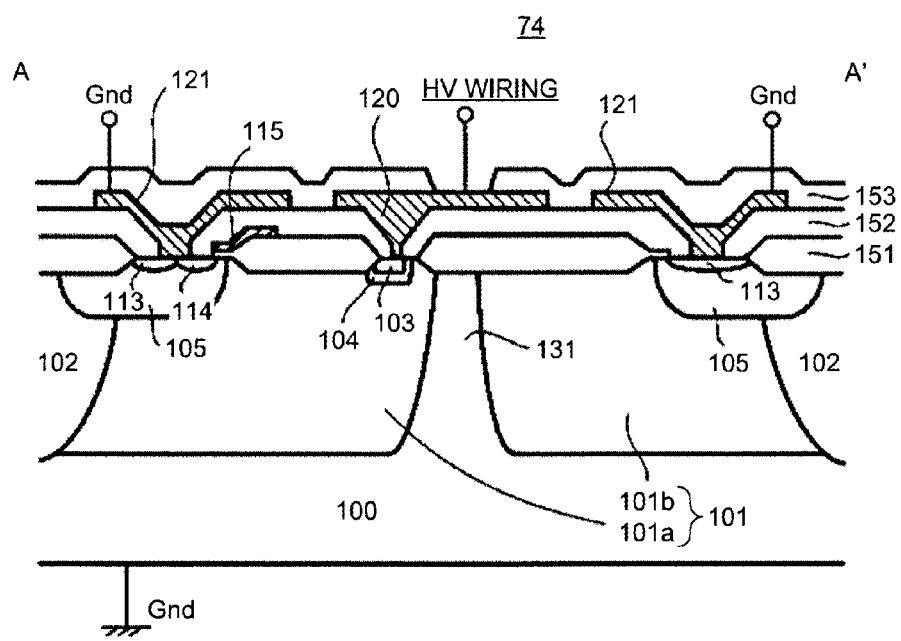
FIG. 8A is a cross sectional view of a principal part of the high voltage MOSFET according to a fourth embodiment of the invention.
Figure 8B:
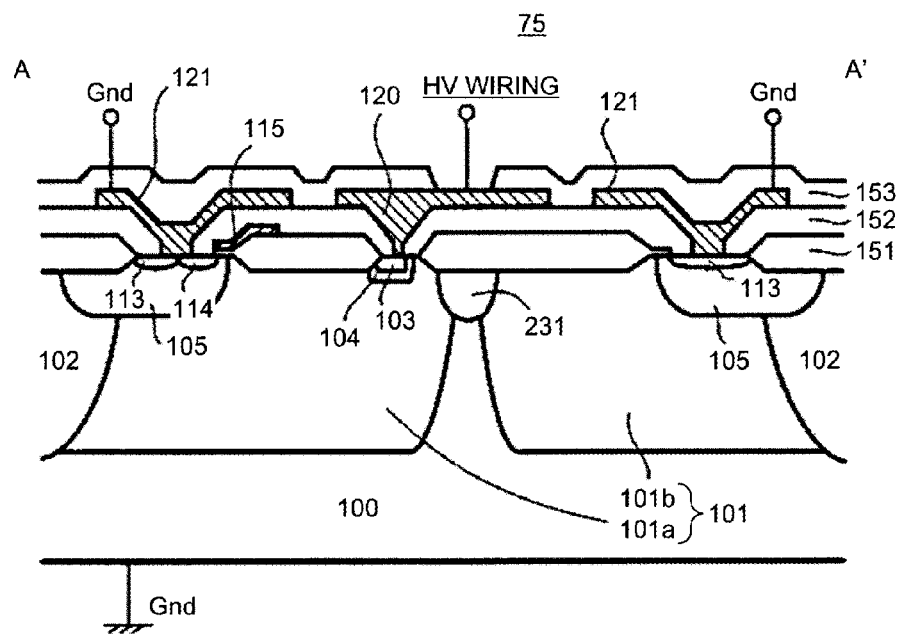
FIG. 8B is a cross sectional view of a principal part of the high voltage MOSFET according to the fourth embodiment of the invention.

FIGS. 8A and 8B are cross sectional views of a principal part of the high voltage MOSFET according to a fourth embodiment of the invention. A high voltage MOSFET 74 shown in FIG. 8A has a structure in which the p⁻-region 131 is formed by making a part of the p⁻-type silicon substrate 100 exposed on its surface. The p⁻-type silicon substrate 100 sandwiched by the n⁻-type region 101a and the n⁻-type region 101b is the p⁻-region 131.

Without being limited to the fourth embodiment, in each of the high voltage MOSFETs according to the invention, when the n⁻-type region 101 is formed in the surface layer of the p⁻-type silicon substrate 100 by preferential diffusion, a p⁻-region 131 dividing the n⁻-type region 101 is not necessarily formed as a diffused layer but can be formed by making the p⁻-type silicon substrate 100 exposed on its surface. In this case, the portion, in which the surface of the p⁻-type silicon substrate 100 is exposed, is formed to have such a width that the n⁻-type region 101a and the n⁻-type region 101b are prevented from contacting each other due to diffusion such as lateral diffusion.

Moreover, as a high voltage MOSFET 75 shown in FIG. 8B, the separating region can be formed between the n⁻-type region 101a and the n⁻-type region 101b by combining a section having the p⁻-type silicon substrate 100 and a p⁻-region 231 as a diffused region.

As explained, according to the fourth embodiment, the effects of the first embodiment can be achieved.

Fifth Embodiment

Figure 9A:
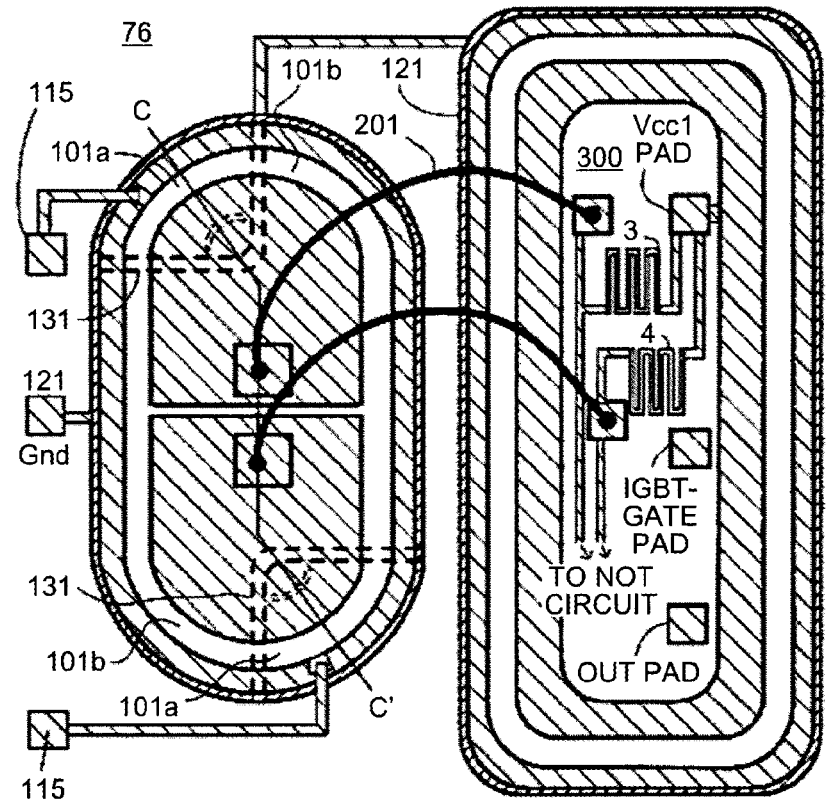
FIG. 9A is a plan view of a principal part of the high voltage according to a fifth embodiment of the invention.
Figure 9B:
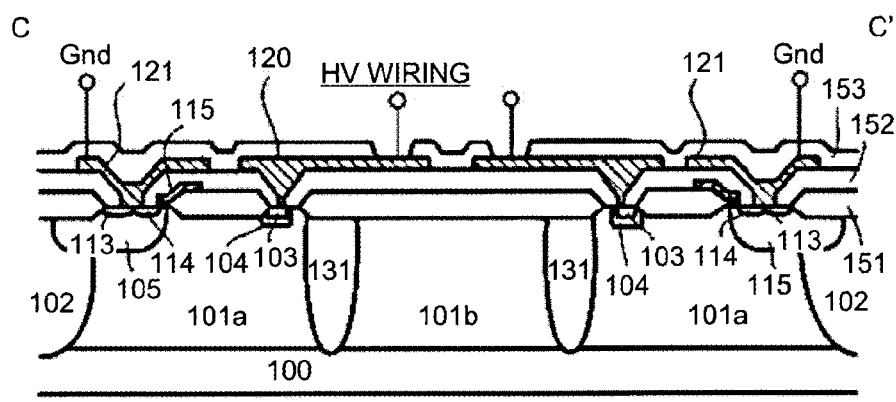
FIG. 9B is a cross sectional view taken along line C-C' in FIG. 9A.

FIG. 9A is a plan view of a principal part of a high voltage IC according to a fifth embodiment of the invention and FIG. 9B is a cross sectional view taken along line C-C' in FIG. 9A. As shown in FIGS. 9A and 9B, a high voltage MOSFET 76 of the fifth embodiment has an n⁻-type region 101 having a planar shape that is an oval-shape like a race track. The high voltage MOSFET 76 further has two p⁻-regions 131 formed in two places to divide the n⁻-type region 101 into two n⁻-type regions 101a and one n⁻-type region 101b. Moreover, the high voltage MOSFET 76 is formed in each of the two n⁻-type regions 101a.

The two MOSFETs correspond to the high voltage MOSFETs 1 and 2, respectively, shown in FIG. 13. A floating electric potential region 300 is the same as that shown in FIG. 2. Also in such a structure, the region as a MOSFET can be made small to enable output capacitances (drain-source capacitance Cds and drain-substrate capacitance Cdsub) to be reduced while maintaining breakdown voltage.

As shown in FIG. 9A, by forming the high voltage MOSFET 76 to have the race-track-like plane figure, the area of the high voltage MOSFET 76 can be made smaller compared with the areas of the two high voltage MOSFETs 71 shown in FIG. 2.

In the fifth embodiment, a high voltage IC has plural separating regions forming plural high voltage MOSFETs. However, without limitation hereto, in the high voltage MOSFET having a race-track-like plane figure, a structure can be provided in which one separating region is provided to form one high voltage MOSFET.

As explained, according to the fifth embodiment, the effects of the first embodiment can be achieved.

Sixth Embodiment

Figure 10A:
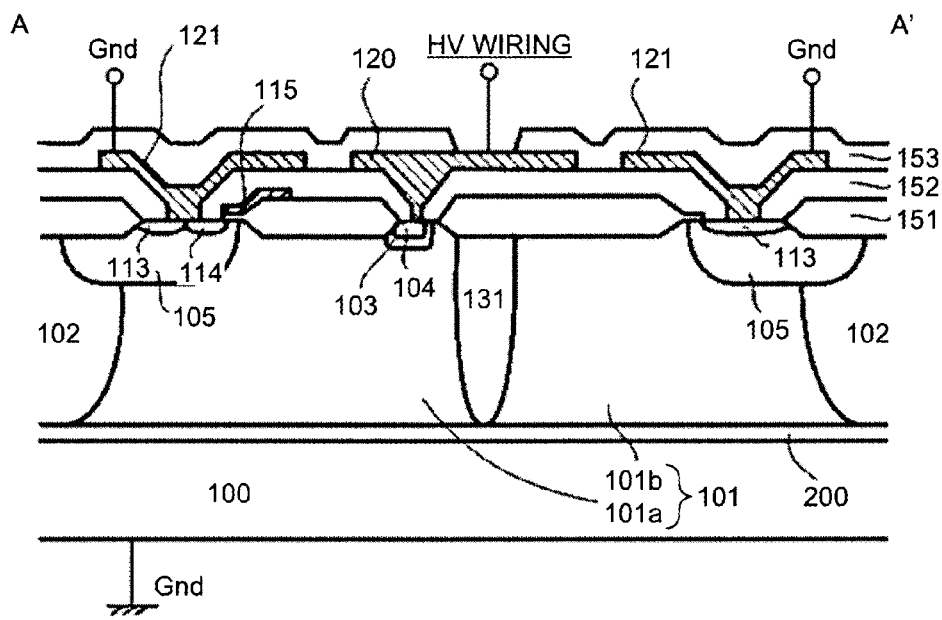
FIG. 10A is a cross sectional view of a principal part of the high voltage MOSFET according to a sixth embodiment of the invention.
Figure 10B:
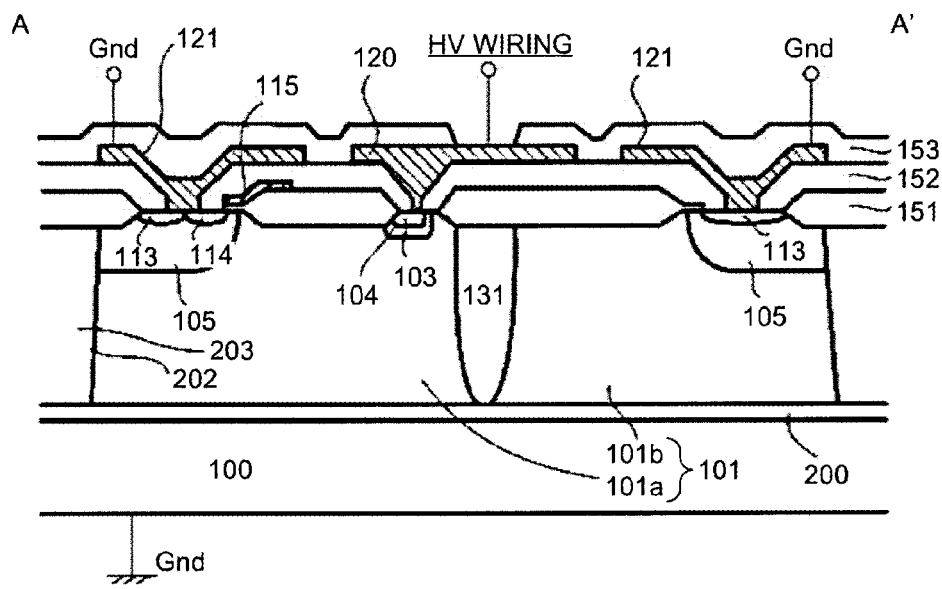
FIG. 10B is a cross sectional view of a principal part of the high voltage MOSFET according to the sixth embodiment of the invention.

FIGS. 10A and 10B are cross sectional views of the principal part of a high voltage MOSFET according to the sixth embodiment of the invention. In the high voltage MOSFETs 77 and 78 shown in FIGS. 10A and 10B, respectively, the difference from the high voltage MOSFET 71 shown in FIGS. 1A and 1B in the first embodiment is the use of an SOI (Silicon on Insulator) substrate.

FIG. 10A shows a high voltage MOSFET 77 having a structure in which a p⁻-type silicon substrate 100 and a silicon substrate (SOI layer) as an n⁻-type region 101 are bonded together with a silicon oxide film 200 provided between. In this case, the phosphorus impurity concentration in the n⁻-type region 101 may be in the range from $1*10^{14}$/cm³ to $1*10^{15}$/cm³. The other structures can be formed in the same way as that of forming the structure of the high voltage MOSFET 71 shown in FIGS. 1A and 1B.

FIG. 10B shows a high voltage MOSFET 78 having, like the high voltage MOSFET 77 shown in FIG. 10A, a structure in which a p⁻-type silicon substrate 100 and a silicon substrate (SOI layer), as an n⁻-type region 101, are bonded together with a silicon oxide film 200 provided between. The difference from the high voltage MOSFET 77 shown in FIG. 10A is that as the separating region, instead of the p⁻ well region 102, a dielectric separating region is formed which is formed of a trench 202 and an insulating film 203, such as a silicon oxide film, formed on the inner surface of the trench 202.

Also in such the high voltage MOSFET 77 and 78, drain-source capacitance Cds can be reduced while maintaining breakdown voltage. Moreover, this structure can be similarly applied to the embodiments other than the first embodiment explained.

As explained, according to the sixth embodiment, the effects of the first embodiment can be achieved.

Seventh Embodiment

Application of the high voltage MOSFET according to the invention is not limited to the field of the level shift device of a high voltage IC. The technology can be applied to semiconductor devices such as a MOSFET and an IGBT, and is suited for a high voltage semiconductor device with a specification defining that an area of a voltage blocking region for ensuring high voltage blocking capability becomes an area that allows driving a current exceeding the current driving capability required. Combination of the p⁻-region and the region at a floating electric potential according to the invention with a MOSFET or an IGBT enables reduction in output capacitances (Cds and Cdsub) while maintaining a voltage blocking characteristic.

Figure 11A:
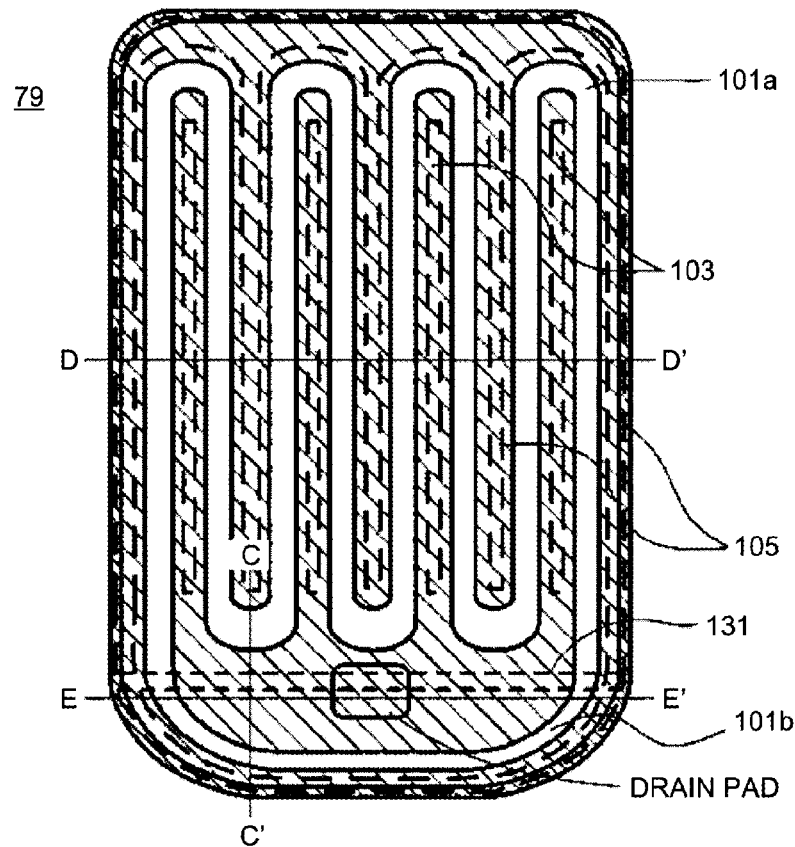
FIG. 11A is a plan view of a principal part of the high voltage MOSFET according to a seventh embodiment of the invention.
Figure 11B:
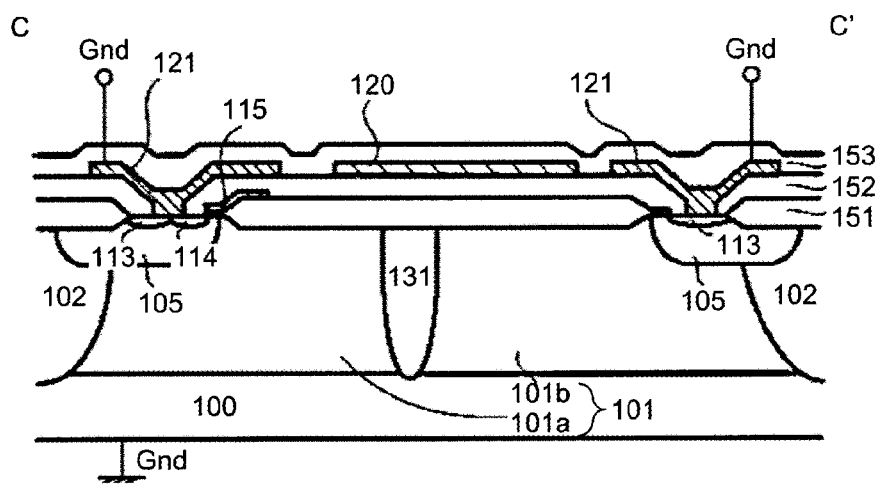
FIG. 11B is a cross sectional view taken along line C-C' in FIG. 11A.
Figure 12A:
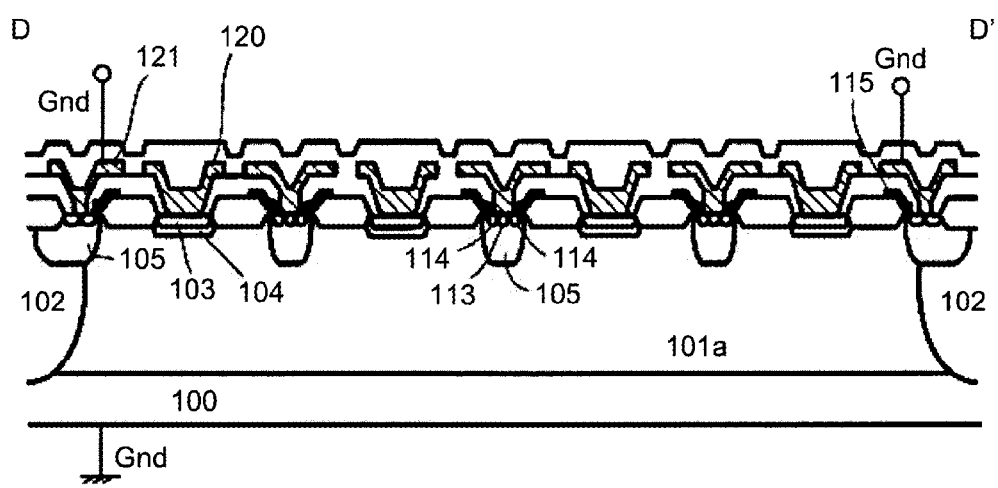
FIG. 12A is a cross sectional view taken along line D-D' in FIG. 11A.
Figure 12B:
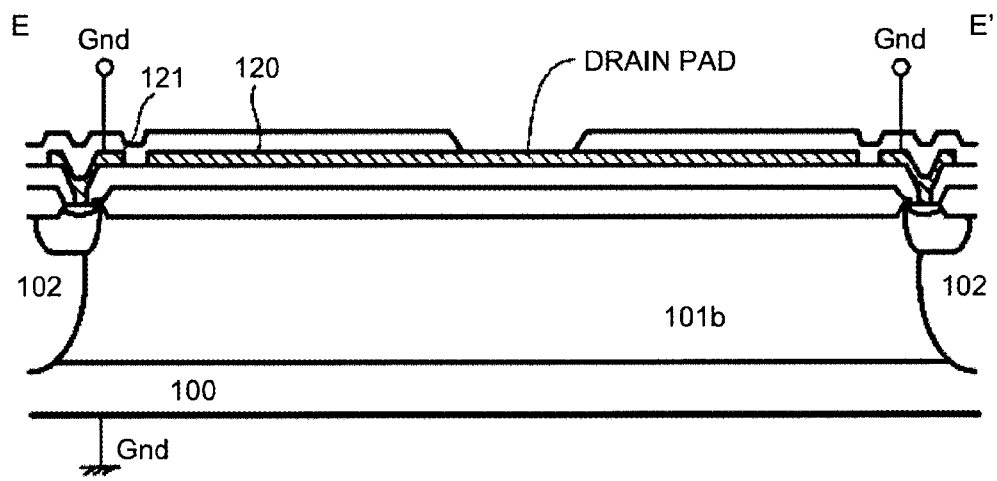
FIG. 12B is a cross sectional view taken along line E-E' in FIG. 11A.

FIG. 11A is a plan view showing a principal part of a high voltage MOSFET according to a seventh embodiment of the invention. FIG. 11B is a cross sectional view taken along line C-C' in FIG. 11A. FIG. 12A is a cross sectional view taken along line D-D' in FIG. 11A, and FIG. 12B is a cross sectional view taken along line E-E' in FIG. 11A.

As shown in FIGS. 11A, 11B, 12A, and 12B, the high voltage MOSFET 79 has a comb-shaped source electrode 121 and a comb-shaped drain electrode 120 formed to oppose each other. Moreover, beneath each of the teeth (straight line section) of the comb-shaped drain electrode 120, a drain n⁺-region 103 and an n offset region 104 are formed. Furthermore, beneath the straight line section of the comb-shaped source electrode 121, a source n⁺-region 114 is formed opposite to the drain n⁺-region 103. Positioning of the gate electrodes 115 is not particularly limited provided each is formed between the source n⁺-region 114 and the drain n⁺-region 103.

In the embodiment, no gate electrode 115 is formed over the n⁻-type region 101b. The gate electrode 115, however, can be formed over the n⁻-type region 101b with the gate electrode 115 made isolated from the gate electrode 115 formed over the n⁻-type region 101a. Here, the electric potential is to be the COM electric potential or a floating electric potential.

Also in the embodiment, by forming a separating region (the p⁻-region 131), the n⁻-type region 101 is divided into the n⁻-type region 101a and the n⁻-type region 101b, and by making the n⁻-type region 101b a region with a floating electric potential, output capacitances can be reduced while device breakdown voltage is maintained.

Moreover, like in the high voltage MOSFET 73 of the third embodiment, plural p⁻-regions 131 as separating regions can be formed. In addition, like in the high voltage MOSFETs 74 and 75 of the fourth embodiment, the p⁻-region 131 as a separating region can be formed by making a part of the p⁻-type silicon substrate 100 exposed on the top surface instead of forming a diffused region, or can be formed by combining the p⁻-type silicon substrate 100 and a p⁻-region made of a diffused region. Furthermore, like in the high voltage MOSFETs 77 and 78 of the sixth embodiment, an SOI substrate can be used.

As explained, according to the seventh embodiment, the effects of the first embodiment can be achieved.

Figure 18:
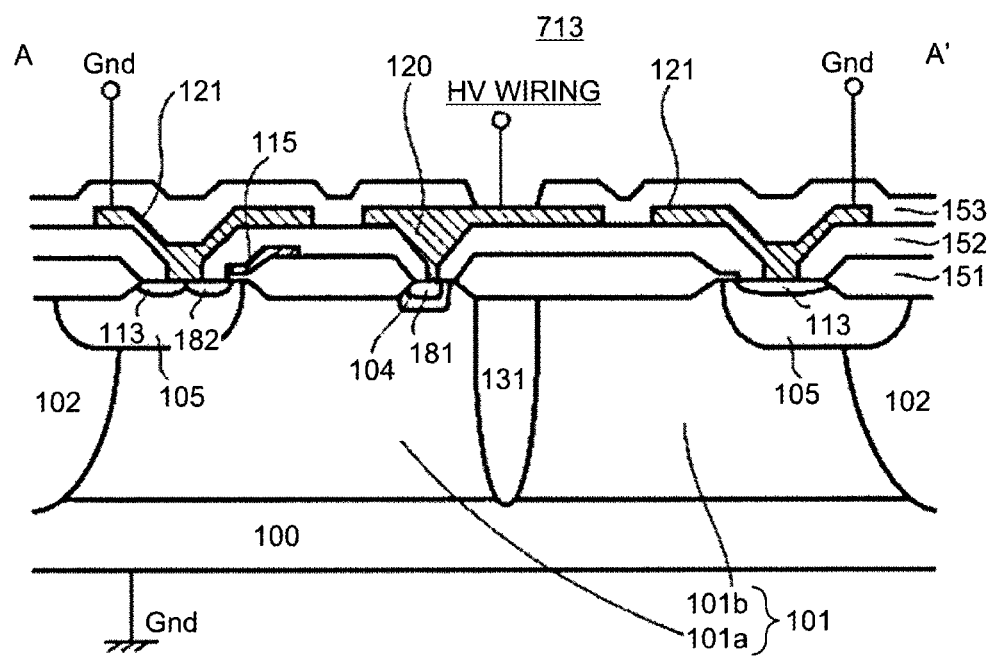
FIG. 18 is a cross sectional view showing a principal part of a high voltage MOSFET as an example of the high voltage MOSFET according to the invention.

In each of the embodiments in the foregoing, explanations were made with respect to high voltage MOSFETs. The invention, however, can be also applied to IGBTs. A high voltage MOSFET 713 shown in FIG. 18 is a specific example of such an IGBT. For forming the high voltage MOSFET 713, in the high voltage MOSFET 71 shown in FIG. 1A, it is necessary only that a pt-type collector region 181 is formed instead of the drain n⁺-region 103 with the source n⁺-region 114 made served as it is as an emitter n⁺-region 182.

In the embodiments in the foregoing, a high voltage MOSFET has been explained. Nonetheless, the embodiments are applicable to an IGBT as well. FIG. 18 is a cross sectional view of a principal part of yet another example of a high voltage MOSFET according to the present invention. Like a high voltage MOSFET 713 shown in FIG. 18, in the high voltage MOSFT shown in FIG. 1A, a p⁺ collector region 181 may be formed instead of the drain n⁺-region 103, which may be regarded, as is, as the source n⁺ region 114.

In the embodiments in the foregoing, the common electric potential is taken as the ground potential. The common electric potential, however, need not be taken as the ground potential.

While the present invention has been particularly shown and described with reference to the preferred embodiments thereof, it will be understood by those skilled in the art that the foregoing and other changes in form and details can be made therein without departing from the spirit and scope of the present invention.

REFERENCE SIGNS LIST 1, 2 high voltage MOSFET
3, 4 load resistor
5, 6 voltage-regulator diode
8, 9 NOT circuit
71, 72, 73, 74, 75 high voltage MOSFET
76, 77, 78, 79 high voltage MOSFET
711, 712, 713 high voltage MOSFET
15 RS flip-flop (RS latch)
16 driver
17, 18 IGBT
20 driver
21 reset terminal R
25 on-signal
26 off-signal
30, 31 low pass filter circuit
41, 42 diode
51, 52 output capacitance
61 control circuit
100 p⁻-type silicon substrate
101, 101a, 101b n⁻-type region
102 p⁻ well region
103 drain n⁺-region
104 n offset region
105 p base region
113 base pick up p⁺-region
114 source n⁺-region
115 gate electrode
120 drain electrode
121 source electrode
131 p⁻-region
151 field oxide film
152 interlayer dielectric film
153 passivation film
161 load resistor
171, 202 trench
172, 203 insulating film
181 p⁺-type collector region
182 emitter n⁺-region
200 silicon oxide film
201 bonding wire
300 floating electric potential region
COM common electric potential point
Vdc positive electrode side terminal of main DC power supply
OUT AC output terminal
EI, E2 auxiliary DC power supply
Vcc1, Vcc2 positive electrode line

The invention claimed is:

1. A high voltage semiconductor device comprising:
a substrate of a first conductivity type;
a voltage blocking region of a second conductivity type positioned on the substrate, the voltage blocking region including a drift region having a drift surface layer, and a floating region having a floating electric potential;
a drain diffused region of the second conductivity type formed in said drift surface layer;
a base region of the first conductivity type having a base surface layer, said base region surrounding the drain diffused region and contacting the voltage blocking region;
a pick-up region of the first conductivity type formed in the base surface layer;
a first electrode receiving a first voltage and electrically connected to the pick-up region;
a second electrode receiving a second voltage higher than the first voltage and electrically connected to the drain diffused region;
a separating region that contacts the substrate and encompasses the voltage blocking region and the base region;
a semiconductor region of the first conductivity type, positioned between the drift region and the floating region so as to separate them from each other, said semiconductor region contacting the separating region and the substrate;
a source diffused region of the second conductivity type formed in the base surface layer and disposed on the drift region, the source diffused region being connected to the first electrode;
a gate electrode disposed on the base surface layer between a portion of the drift region and the source diffused region; and
a base insulating film disposed on the base surface layer between the gate electrode and the base surface layer.

2. The high voltage semiconductor device according to claim 1, wherein the voltage blocking region is a diffused layer selectively formed in a substrate surface layer of the substrate.

3. The high voltage semiconductor device according to claim 2, wherein the separating region is a diffused region selectively formed in the substrate surface layer and has an impurity concentration that is higher than that of the substrate.

4. The high voltage semiconductor device according to claim 2, wherein the separating region includes insulating material embedded in a trench that extends from the substrate surface layer.

5. The high voltage semiconductor device according to claim 2, wherein the semiconductor region is a diffused region selectively formed in the substrate surface layer.

6. The high voltage semiconductor device according to claim 2, wherein the semiconductor region is disposed within a trench in the substrate.

7. The high voltage semiconductor device according to claim 1, wherein the voltage blocking region is an epitaxial layer of the second conductivity type.

8. The high voltage semiconductor device according to claim 7, wherein the epitaxial layer includes one surface that is further from the substrate than any other surface of the epitaxial layer, the separating region being a diffused region having a depth equal to a distance from the one surface to the substrate, and having an impurity concentration that is higher than that of the substrate.

9. The high voltage semiconductor device according to claim 7, wherein the epitaxial layer includes one surface that is further from the substrate than any other surface of the epitaxial layer, the separating region being formed of an insulating material embedded within a trench in the substrate, the trench having a depth equal to a distance from the one surface to the substrate.

10. The high voltage semiconductor device according to claim 7, wherein the epitaxial layer includes one surface that is further from the substrate than any other surface of the epitaxial layer, the semiconductor region being a diffused region having a depth equal to a distance from the one surface to the substrate.

11. The high voltage semiconductor device according to claim 1, further including a substrate insulating film on the substrate, wherein the voltage blocking region is an SOI layer disposed on the substrate with the substrate insulating film therebetween.

12. The high voltage semiconductor device according to claim 11, wherein the SOI layer includes one surface that is further from the substrate insulating film than any other surface of the SOI layer, the separating region being a diffused region having a depth equal to a distance from the one surface to the substrate insulating film, and having an impurity concentration that is higher than that of the substrate.

13. The high voltage semiconductor device according to claim 11, wherein the SOI layer includes one surface that is further from the substrate insulating film than any other surface of the SOI layer, and the separating region includes an insulating material and is embedded within a trench having a depth equal to a distance from the one surface of the SOI layer to the substrate insulating film.

14. The high voltage semiconductor device according to claim 11, wherein the SOI layer includes one surface that is further from the substrate insulating film than any other surface of the SOI layer, the semiconductor region being a diffused region having a depth that is equal to a distance from the one surface to the substrate insulating film.

15. The high voltage semiconductor device according to claim 1, further including a floating region insulating film disposed on the floating region, wherein either the second electrode or a field plate that is connected to the second electrode is arranged on the floating region with the floating region insulating film therebetween.

16. The high voltage semiconductor device according to claim 1, wherein the floating region includes a plurality of separated floating regions.

17. The high voltage semiconductor device according to claim 16, wherein the plurality of separated floating regions includes two adjacent floating regions, wherein the semiconductor region is a first semiconductor region, further including a second semiconductor region of the first conductivity type disposed between the two, adjacent floating regions and contacting the first semiconductor region, the separating region, and the substrate.

18. The high voltage semiconductor device according to claim 1, wherein before the occurrence of an avalanche breakdown at either a p-n junction of the semiconductor region and the drift region or a p-n junction of the semiconductor region and the floating region, depletion layers expanding from the respective p-n junctions into the semiconductor region join together.

19. A high voltage semiconductor device comprising:
a substrate of a first conductivity type;
a voltage blocking region of a second conductivity type positioned on the substrate, the voltage blocking region including a drift region having a drift surface layer, and a floating region having a floating electric potential;
a collector diffused region of the first conductivity type formed in said drift surface layer;
a base region of the first conductivity type having a base surface layer and encompassing the collector diffused region, the base region being separate from the collector diffused region and contacting the voltage blocking region;
a pick-up region of the first conductivity type disposed in the base surface layer;
a first electrode receiving a first voltage and electrically connected to the pick-up region;
a second electrode receiving a second voltage higher than the first voltage and electrically connected to the collector diffused region;
a separating region that contacts the substrate and surrounds the voltage blocking region and the base region;
a semiconductor region of the first conductivity type, provided between the drift region and the floating region so as to separate them from each other, and contacting the separating region and the substrate;
an emitter diffused region of the second conductivity type formed in the base surface layer and disposed on the drift region, the emitter diffused region connected to the first electrode;
a gate electrode disposed on the base surface layer between a portion of the drift region and the emitter diffused region; and
a base insulating film disposed on the base surface layer between the gate electrode and the base surface layer.

20. The high voltage semiconductor device according to claim 19, wherein the drift region includes a plurality of separated drift regions.

21. The high voltage semiconductor device according to claim 20, wherein the plurality of separated floating regions includes two adjacent floating regions, wherein the semiconductor region is a first semiconductor region, further including a second semiconductor region of the first conductivity type disposed between the two, adjacent floating regions and contacting the first semiconductor region, the separating region, and the substrate.

22. The high voltage semiconductor device according to claim 19, wherein before the occurrence of an avalanche breakdown at either a p-n junction of the semiconductor region and the drift region or a p-n junction of the semiconductor region and the floating region, depletion layers expanding from the respective p-n junctions into the semiconductor region join together.

* * * * *